(12) United States Patent
Kojima et al.

(10) Patent No.: US 8,968,866 B2
(45) Date of Patent: Mar. 3, 2015

(54) SURFACE-COATED CUTTING TOOL

(75) Inventors: Chikako Kojima, Itami (JP); Yoshio Okada, Itami (JP); Hideaki Kanaoka, Itami (JP); Hiroyuki Morimoto, Itami (JP); Anongsack Paseuth, Itami (JP); Erika Iwai, Itami (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 138 days.

(21) Appl. No.: 13/634,209

(22) PCT Filed: Dec. 5, 2011

(86) PCT No.: PCT/JP2011/078087
§ 371 (c)(1),
(2), (4) Date: Sep. 11, 2012

(87) PCT Pub. No.: WO2012/153438
PCT Pub. Date: Nov. 15, 2012

(65) Prior Publication Data
US 2013/0045057 A1  Feb. 21, 2013
US 2013/0279998 A9  Oct. 24, 2013

(30) Foreign Application Priority Data

May 10, 2011  (JP) .................................. 2011-105061
May 10, 2011  (JP) .................................. 2011-105062
May 10, 2011  (JP) .................................. 2011-105063

(51) Int. Cl.
C23C 16/00    (2006.01)
C23C 16/34    (2006.01)
(Continued)

(52) U.S. Cl.
CPC ............... *C23C 16/34* (2013.01); *C23C 16/403* (2013.01); *C23C 28/044* (2013.01); *C23C 30/005* (2013.01)
USPC ............... 428/325; 51/307; 51/309; 428/698; 428/701; 428/702

(58) Field of Classification Search
USPC ............. 51/307, 309; 428/325, 698, 701, 702
See application file for complete search history.

(56) References Cited

U.S. PATENT DOCUMENTS 5,766,782 A * 6/1998 Ljungberg ...................... 51/307
5,851,687 A * 12/1998 Ljungberg .................... 428/698
(Continued)

FOREIGN PATENT DOCUMENTS

CN    1456703 A    11/2003
EP    0 999 293 A1    5/2000
(Continued)

OTHER PUBLICATIONS

Office Action in Chinese Patent Application No. 201180019112.6, dated May 6, 2014.
(Continued)

*Primary Examiner* — Archene Turner
(74) *Attorney, Agent, or Firm* — Venable LLP; Michael A. Sartori; Tamatane J. Aga

(57) ABSTRACT

A surface-coated cutting tool excellent in wear resistance is provided. The surface-coated cutting tool of the present invention includes a base material and a coating formed on the base material. The coating includes an inner layer and an outer layer. The inner layer is a single layer or a multilayer stack constituted of two or more layers made of at least one element selected from the group consisting of group IVa elements, group Va elements, group VIa elements in the periodic table, Al, and Si, or a compound of at least one element selected from this group and at least one element selected from the group consisting of carbon, nitrogen, oxygen, and boron. The outer layer includes α-aluminum oxide as a main component and exhibits an equivalent peak intensity PR(024) of a (024) plane of x-ray diffraction of larger than 1.3.

10 Claims, 2 Drawing Sheets

TANGENT INTERSECTION ANGLE    DEEPEST POINT

(51) Int. Cl.
   *C23C 16/40*   (2006.01)
   *C23C 28/04*   (2006.01)
   *C23C 30/00*   (2006.01)

(56) References Cited

U.S. PATENT DOCUMENTS

| | | | |
|---|---|---|---|
| 6,333,103 | B1 | 12/2001 | Ishii et al. |
| 6,337,152 | B1 * | 1/2002 | Kukino et al. ............... 428/698 |
| 6,713,172 | B2 * | 3/2004 | Ljungberg et al. ............ 428/325 |
| 7,135,221 | B2 * | 11/2006 | Ruppi et al. ................ 428/698 |
| 7,163,735 | B2 * | 1/2007 | Ruppi ........................ 428/701 |
| 7,396,581 | B2 | 7/2008 | Ruppi |
| 7,442,431 | B2 * | 10/2008 | Ruppi ........................ 428/702 |
| 2004/0028951 | A1 | 2/2004 | Ruppi |
| 2004/0144302 | A1 | 7/2004 | Ljungberg et al. |
| 2005/0276990 | A1 | 12/2005 | Kohara et al. |
| 2007/0298281 | A1 | 12/2007 | Andersson et al. |

FOREIGN PATENT DOCUMENTS

| | | |
|---|---|---|
| EP | 1 209 255 A2 | 5/2002 |
| EP | 1 655 387 A1 | 5/2006 |
| JP | 62-228305 A | 10/1987 |
| JP | 7-216549 A | 8/1995 |
| JP | 9-507528 | 7/1997 |
| JP | 10-156606 A | 6/1998 |
| JP | 11-138308 A | 5/1999 |
| JP | 11-335870 A | 12/1999 |
| JP | 2000-144427 A | 5/2000 |
| JP | 2002-120105 A | 4/2002 |
| JP | 2002-205205 A | 7/2002 |
| JP | 2003-340610 A | 12/2003 |
| JP | 2008-073847 A | 4/2008 |
| KR | 10-2003-0087577 A | 11/2003 |
| KR | 10-2005-0056952 A | 6/2005 |
| WO | WO-95/19457 A1 | 7/1995 |

OTHER PUBLICATIONS

Office Action in Korean Patent Application No. 10-2012-7025526, dated May 16, 2014.

Extended European Search Report in European Patent Application No. 11860104.6, dated Dec. 4, 2014.

* cited by examiner

SURFACE-COATED CUTTING TOOL

TECHNICAL FIELD

The present invention relates to a surface-coated cutting tool including a base material and a coating formed on the base material.

BACKGROUND ART

A surface-coated cutting tool used for cutting steel, cast iron and the like generally includes a base material made of a tungsten-carbide-based cemented carbide and a coating covering the surface of the base material. The coating is a stack of two or more layers such as Ti compound layer and alumina layer. Here, the alumina layer which forms the coating has advantages of excellent oxidation resistance and heat-resistant stability as well as high hardness. Meanwhile, the alumina layer has a disadvantage that it has a relatively lower strength and is brittle than the Ti compound layer. Due to this disadvantage, chipping may occur to the cutting edge or wear of the cutting edge may increase, for example, when the cutting tool cuts a steel or cast iron under severe conditions such as high-speed cutting or high-speed and high-feed-rate cutting.

Trying to overcome this disadvantage of the alumina layer, Japanese Patent Laying-Open No. 11-138308 (PTL 1) for example provides different crystal structures formed respectively in the upper portion and the lower portion of the alumina layer. Specifically, the lower portion of the alumina layer is formed of a longitudinal diversified crystal structure and the upper portion of the alumina layer is formed of a longitudinal uniform crystal structure.

Further, according to Japanese Patent Laying-Open No. 2002-120105 (PTL 2), when an alumina layer is to be formed, a gas to which $H_2S$ gas and $SO_2$ gas are added is introduced and further an increased amount of $CO_2$ is introduced to form the alumina layer. Accordingly, the alumina layer is formed that has a crystal structure mainly constituted of α-crystal and satisfies the following relations. Namely, the ratio between x-ray diffraction peak intensity I(030) of the (030) plane that is a main peak and x-ray diffraction peak intensity I(104) of the (104) plane satisfies I(030)/I(104)>1, and x-ray diffraction peak intensity I(012) of the (012) plane satisfies I(012)/I(030)>1.

Here, the α-alumina with its orientation in the (030) plane has a higher crystallographic density than the α-alumina with its orientation in the (104) plane. Therefore, the x-ray diffraction peak intensity of the (104) plane can be increased to thereby form the α-alumina crystal formed of high-density crystal, as described above.

Japanese Patent Laying-Open No. 07-216549 (PTL 3) discloses an alumina layer having a single-phase α-structure textured in the (110) direction of x-ray diffraction so that texture coefficient TC (hkl) has a value larger than 1.5. This alumina layer has good adherence to the underlying base material and therefore has an advantage that the wear resistance is excellent.

European Patent Publication No. 1655387A1 (PTL 4) discloses an alumina layer having a texture coefficient TC (110) of the (110) plane of more than 2 and a texture coefficient of a crystal plane other than the (110) plane of less than 1.5. Further, according to PTL 4, an alumina contact layer which is a lower layer of the alumina layer also contains Al so that the bonding strength between the alumina contact layer and the alumina layer is increased.

Japanese National Patent Publication No. 09-507528 (PTL 5) discloses an alumina layer having a thickness of 2.5 to 25 μm and a crystal grain size of 0.5 to 4 μm. This alumina layer has a texture coefficient TC of larger than 2.5 and has a single-phase α-structure textured in the (104) direction. The alumina layer having such a crystal structure exhibits a property that it is excellent in wear resistance and toughness.

Japanese Patent Laying-Open No. 10-156606 (PTL 6) discloses a surface-coated cutting tool including a base material with its surface coated with an inner layer which is further covered with an alumina layer. According to PTL 6, in addition to a non-oxidizing gas component which is a main component, an oxidizing gas is further introduced to form the inner layer. Accordingly, the (110) plane of the alumina layer exhibits a maximum x-ray diffraction peak intensity, and lattice stripes of the alumina layer and the inner layer continue at the interface therebetween.

As an approach for improving the strength of the alumina layer other than those explained above in connection with PTLs 1 to 6, there is also a technique of adjusting the thickness and the surface roughness of the alumina layer as well as the average grain size of grains constituting the alumina layer. For example, according to Japanese Patent Laying-Open No. 62-228305 (PTL 7), the alumina layer has a thickness of 0.5 to 5 μm and a surface roughness of not more than 1 μm so that the strength and the adherence of the alumina layer are increased.

Further, WO1995/019457 (PTL 8) discloses an alumina layer having a thickness of 2.5 to 25 μm and a grain size of its constituent grains of 0.5 to 4 μm. This alumina layer has a single-phase α-structure textured in the direction of the (104) plane. Japanese Patent Laying-Open No. 2002-205205 (PTL 9) also discloses an alumina layer with its thickness adjusted to 2.5 μm or less by using alumina grains having an average grain size of 2 μm or less. An alumina layer having such a thickness and such a grain size can be formed to thereby enhance the toughness of the surface-coated cutting tool.

CITATION LIST

Patent Literature

PTL 1: Japanese Patent Laying-Open No. 11-138308
PTL 2: Japanese Patent Laying-Open No. 2002-120105
PTL 3: Japanese Patent Laying-Open No. 07-216549
PTL 4: European Patent Publication No. 1655387A1
PTL 5: Japanese National Patent Publication No. 09-507528
PTL 6: Japanese Patent Laying-Open No. 10-156606
PTL 7: Japanese Patent Laying-Open No. 62-228305
PTL 8: WO1995/019457
PTL 9: Japanese Patent Laying-Open No. 2002-205205

SUMMARY OF INVENTION

Technical Problem

The alumina layers formed by the above-described methods of PTLs 1 to 9, however, do not have a sufficient strength and the coating is likely to wear when used for cutting. Further, the conventional technique varies the conditions under which the alumina layer is formed, machines the alumina layer, or forms a stack of multiple alumina layers to thereby reduce the roughness and the size of the grains constituting the alumina layer. However, the alumina layer has an insufficient strength and is likely to wear.

The present invention has been made in view of the present circumstances as described above, and an object of the invention is to provide a surface-coated cutting tool excellent in wear resistance.

Solution to Problem

The inventors of the present invention have conducted thorough studies of the crystal orientation of α-alumina which forms the alumina layer to find that the equivalent peak intensity of the (024) plane, which is perpendicular to the crystal plane of the material forming the base material for the alumina layer, can be increased to thereby improve the strength of the alumina layer, and completed the present invention. Further, the surface of the alumina layer has depressions/protrusions formed due to α-aluminum oxide crystal grains. It has been found that the angle between intersecting tangents drawn respectively from the deepest points of depressions (the angle is hereinafter also referred to as "tangent intersection angle") of the depressions/protrusions can be increased to thereby allow the alumina layer (hereinafter also referred to as "outer layer") to horizontally grow relative to the base material, allow the outer layer to have a dense structure, and improve the strength.

Further, it has been found that the balance of the equivalent peak intensity of the (012) plane which is a crystal plane parallel to the (024) plane of the outer layer and the equivalent peak intensity of the (110) plane which is a crystal plane perpendicular to the (024) plane can be made larger than one, to thereby enhance the strength and the adherence of the alumina layer.

The inventors of the present invention have also focused on the smoothness of the surface of the α-aluminum oxide crystal grains and found that a higher smoothness (namely a larger surface R) of the surface of the α-aluminum oxide crystal grains can provide a higher adhesion resistance of the coating.

Specifically, a surface-coated cutting tool of the present invention includes a base material and a coating formed on the base material. The coating includes at least an inner layer and an outer layer. The inner layer is a single layer or a multilayer stack constituted of two or more layers made of at least one element selected from the group consisting of group IVa elements, group Va elements, group VIa elements in the periodic table, Al, and Si, or a compound of at least one element selected from the group consisting of group IVa elements, group Va elements, group VIa elements in the periodic table, Al, and Si and at least one element selected from the group consisting of carbon, nitrogen, oxygen, and boron. The outer layer includes α-aluminum oxide as a main component and exhibits an equivalent peak intensity PR(024) of a (024) plane of x-ray diffraction of larger than 1.3.

Preferably, the equivalent peak intensity PR(024) is larger than 2.0. Preferably, the alumina layer has the (024) plane exhibiting a maximum peak of x-ray diffraction.

Preferably, the outer layer has a (012) plane exhibiting a maximum peak intensity of x-ray diffraction.

Preferably, the outer layer includes α-aluminum oxide crystal grains, and at least 50% of α-aluminum oxide crystal grains located in a surface of the outer layer in a cross section of the surface-coated cutting tool cut along a plane including a normal to a surface of the coating satisfies a condition that a tangent intersection angle between intersecting tangents is not less than 100° and not more than 170°, where one of the intersecting tangents extends from a deepest point of a depression formed by one combination of two α-aluminum oxide crystal grains adjacent to each other among three α-aluminum oxide crystal grains adjacent to each other and located in the surface of the outer layer, and the other of the intersecting tangents extends from a deepest point of a depression formed by the other combination of two α-aluminum oxide crystal grains adjacent to each other among the three α-aluminum oxide crystal grains.

Preferably, the outer layer exhibits an equivalent peak intensity PR(110) of a (110) plane of x-ray diffraction and an equivalent peak intensity PR(012) of a (012) plane of x-ray diffraction that are both larger than 1.

Preferably, the outer layer includes α-aluminum oxide crystal grains, and at least 30% of α-aluminum oxide crystal grains that are located in a surface of the outer layer in a cross section of the surface-coated cutting tool cut along a plane including a normal to a surface of the coating and are observed at a magnification of 10000 satisfies a condition that a radius (surface R) of an inscribed circle abutting on a surface protrusion of one α-aluminum oxide crystal grain is not less than 3 mm.

Advantageous Effects of Invention

The surface-coated cutting tool of the present invention is configured in the above-described manner to thereby enable the wear resistance to be increased.

DESCRIPTION OF EMBODIMENTS

Figure 1:
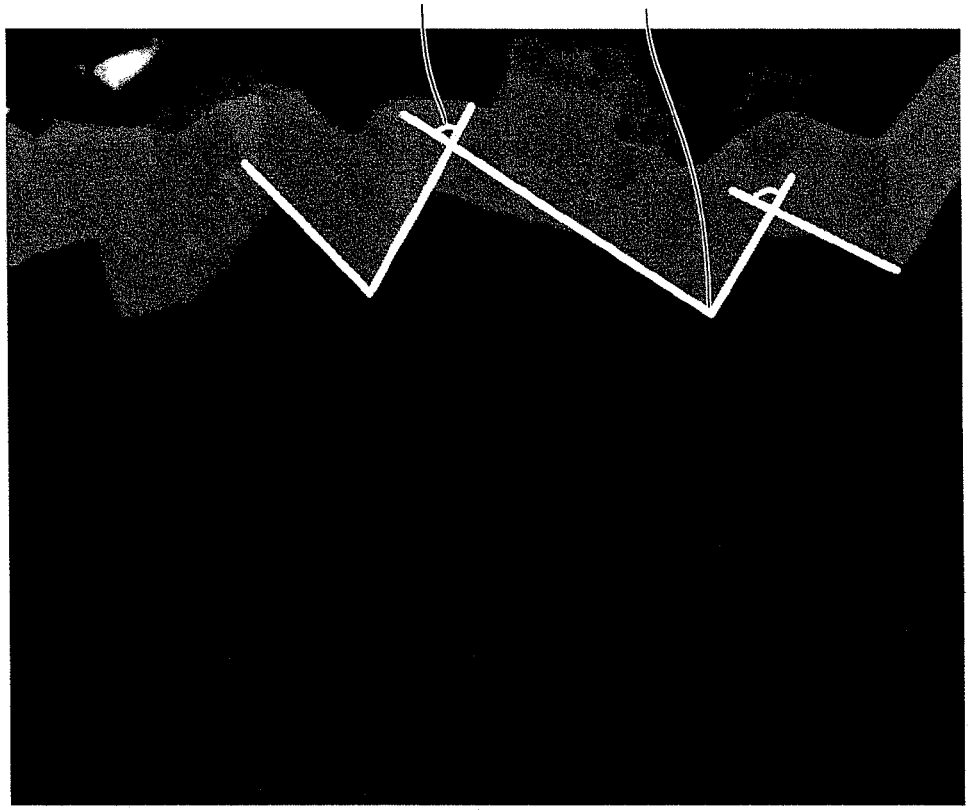
FIG. 1 shows an image, observed with a field emission scanning electron microscope, of a surface and its vicinity of an outer layer in a cross section cut along a plane including a normal to the surface of a coating of a surface-coated cutting tool.

In the following, the present invention will be described in detail. It is noted that the thickness of a layer or the thickness of a coating of the present invention is measured with an optical microscope or scanning electron microscope (SEM), and the composition of each layer forming the coating is measured with an energy dispersive x-ray spectroscopy (EDS) apparatus or the like.

<Surface-Coated Cutting Tool>

A surface-coated cutting tool of the present invention includes a base material and a coating formed on the base material. The surface-coated cutting tool of the present invention having such a basic structure can be used highly advantageously as, for example, a drill, an end-mill, an indexable insert for milling, or machining, a metal-slitting saw, a gear cutting tool, a reamer, a tap, a cutting insert for pin-milling of a crankshaft, or the like.

A rake face which is a constituent part of the surface of the surface-coated cutting tool of the present invention refers to a face that contacts swarf of a workpiece when cutting work is being done. Such a rake face preferably has a chip breaker in a protruded or uneven shape. The chip breaker is provided to thereby curl and break the swarf into fine fragments of an appropriate size. Therefore, the swarf can be prevented from being caught and interfering the cutting work. It is noted that the chip breaker may not necessarily be formed, and the effects of the present invention are not lost even if the chip breaker is not provided.

<Base Material>

As the base material of the surface-coated cutting tool of the present invention, any conventionally known base material which is known as a base material of such a cutting tool may be used without being particularly limited. For example, cemented carbide (including, for example, WC-based cemented carbide, the one containing WC and Co, and the one containing WC and Co and additionally a carbonitride of Ti, Ta, Nb or the like), cermet (having TiC, TiN, TiCN or the like as a main component), high-speed steel, ceramic (such as titanium carbide, silicon carbide, silicon nitride, aluminum nitride, aluminum oxide, and a mixture thereof), cubic boron nitride sintered body, diamond sintered body, and the like, may be examples of such a base material. In the case where a cemented carbide is used as such a base material, the cemented carbide may include free carbon or abnormal phase called η phase in its structure to still provide the effects of the present invention.

It is noted that these base materials may have respective surfaces reformed. For example, in the case of cemented carbide, a β-free layer may be formed in its surface. In the case of cermet, a surface-hardened layer may be formed. Even in such a case where the surface is reformed, the effects of the present invention are still exhibited.

<Coating>

The coating of the present invention includes at least an inner layer and an outer layer. The inner layer is a single layer or a multilayer stack constituted of two or more layers and the single layer or the multilayer stack is made of at least one element selected from the group consisting of group IVa elements, group Va elements, group VIa elements in the periodic table, Al, and Si, or a compound of at least one element selected from the group consisting of group IVa elements, group Va elements, group VIa elements in the periodic table, Al, and Si and at least one element selected from the group consisting of carbon, nitrogen, oxygen, and boron. The outer layer includes α-aluminum oxide as a main component and exhibits an equivalent peak intensity PR of a (024) plane of x-ray diffraction of larger than 1.3.

The plane index of the (024) plane and that of the (012) plane represent the same direction, and the arrangement of atoms of the (024) plane corresponds to a half of the (012) plane. Therefore, the equivalent peak intensity of the (024) plane can be increased so that it is larger than 1.3, to allow a greater number of atoms to be aligned in the direction perpendicular to the base material. Thus, the strength of the alumina layer can be increased. A coating having such an alumina layer is excellent in wear resistance and exhibits excellent performance that fracture is less likely to occur.

Regarding the outer layer, preferably the (012) plane exhibits a maximum peak intensity of x-ray diffraction.

The plane index of the (024) plane represents the same direction as the (012) plane, and the arrangement of atoms of the (024) plane corresponds to a half of the (012) plane. Therefore, the equivalent peak intensity of the (024) plane can be increased so that it is larger than 1.3, to allow a greater number of atoms to be aligned in the direction perpendicular to the base material. Thus, the strength of the outer layer can be increased. Moreover, in the outer layer, the (012) plane exhibits a maximum peak intensity of x-ray diffraction, and therefore, the arrangement of atoms in the direction perpendicular to the base material is strongest and the strength of the alumina layer can be enhanced. A coating having such an outer layer is excellent in wear resistance and exhibits excellent performance that fracture is less likely to occur.

Regarding the outer layer, preferably both the equivalent peak intensity PR(110) of the (110) plane of the x-ray diffraction and the equivalent peak intensity PR(012) of the (012) plane of x-ray diffraction are larger than 1. Accordingly, atoms are arranged in the direction in which α-aluminum oxide grows and the direction perpendicular thereto, and thus the strength and the adherence of the outer layer can be increased. The coating having such an outer layer is excellent in wear resistance and exhibits excellent performance that fracture is less likely to occur.

Such a coating of the present invention includes an embodiment in which the coating covers the whole surface of the base material, includes an embodiment in which the coating partially fails to be formed, and further includes an embodiment in which the manner of stacking layers of the coating is different in a part of the coating. Further, the coating of the present invention preferably has a thickness of the whole coating of not less than 2 μm and not more than 25 μm. If the thickness is less than 2 μm, the wear resistance may be deteriorated. If the thickness is larger than 25 μm, the adherence to the base material and the fracture resistance may be deteriorated. A particularly preferred thickness of such a coating is not less than 3 μm and not more than 20 μm. In the following, each of the constituent layers of such a coating will be described.

Regarding the present invention, the coating preferably includes a binder layer, an inner layer, an alumina binder layer, an outer layer, and a state indication layer in this order from the base-material side. In the following, each of the layers constituting the coating will be described in the order from the one on the base-material side.

<Binder Layer>

The coating of the present invention preferably includes a binder layer (a layer abutting on the base material) between the base material and the inner layer, and the binder layer is preferably made of a nitride of Ti. The binder layer with such a composition has high adherence to the base material and can prevent the coating from entirely peeling off even under harsh cutting conditions. Such a binder layer can be formed to obtain adherence which is sufficient for enduring cutting even when a compressive residual stress is exerted on at least one layer of the coating. The thickness of the binder layer is preferably not less than 0.05 μm and not more than 1 μm.

<Inner Layer>

The coating of the present invention preferably includes at least one inner layer. The inner layer is a single layer or a multilayer stack constituted of two or more layers made of at least one element selected from the group consisting of group IVa elements, group Va elements, group VIa elements in the periodic table, Al, and Si, or a compound of at least one element selected from the group consisting of group IVa elements, group Va elements, group VIa elements in the periodic table, Al, and Si and at least one element selected from the group consisting of carbon, nitrogen, oxygen, and boron. The inner layer containing nitrogen and the former group of elements is excellent in toughness and has an advantage that the coating is less likely to be broken even if the thickness is increased. In contrast, the inner layer containing carbon and nitrogen and the former group of elements can improve the crater wear resistance. Further, the inner layer containing oxygen is excellent in anti oxidation and adhesion resistance and is therefore preferred. It is noted that the inner layer is not limited to an inner layer made of a compound, and includes an inner layer made of a single one of group IVa elements, group Va elements, group VIa elements in the periodic table, Al, and Si.

The inner layer is preferably made of at least one element selected from the group consisting of Cr, Al, Ti, and Si or a compound of at least one element selected from this group and at least one element selected from the group consisting of carbon, nitrogen, oxygen, and boron. The inner layer is more preferably a layer including TiCN as a main component. "Including TiCN as a main component" here means that 90% by mass or more of TiCN is included, and preferably means that the inner layer is made of TiCN only except for inevitable impurities. The atomic ratio between the elements included in such a TiCN (carbonitride of Ti) includes various conventionally known atomic ratios and the atomic ratio here is not particularly limited.

In the case where the compound of the present invention is expressed by a chemical formula such as TiN, the atomic ratio includes various conventionally known atomic ratios if the atomic ratio is not particularly limited, and is not necessarily limited to those in the stoichiometric range only. For example, in the case where the compound is simply expressed as "TiCN", the atomic ratio between "Ti" and "C" and "N" is not limited to 50:25:25 only. Further, in the case where the compound is expressed as "TiN" as well, the atomic ratio between "Ti" and "N" is not limited to 50:50 only. These atomic ratios include various conventionally known atomic ratios.

The inner layer preferably has an average thickness of not less than 2 μm and not more than 20 μm. The inner layer satisfying this condition can appropriately keep the balance between the wear resistance and the fracture resistance. If the thickness of the inner layer is larger than 20 μm, the fracture resistance deteriorates, which may not be preferred in some cases. If the thickness of the inner layer is less than 2 μm, wear of the coating increases in a high-speed cutting process, which is not preferred.

<Alumina Binder Layer>

The coating of the present invention preferably includes an alumina binder layer between the inner layer and the outer layer which is described below. The alumina binder layer is provided to thereby increase the adherence force between the inner layer and the outer layer and make it less likely that the outer layer peels off.

Regarding the alumina binder layer, in order to increase the adherence force between the inner layer and the outer layer, the alumina binder layer preferably has a considerably fine acicular structure in its surface. An example of the alumina binder layer may be a $TiB_xN_y$ (where x and y represent an atomic ratio and satisfy $0.001 \leq x/(x+y) \leq 0.2$) layer located directly on the inner layer.

Further, such an alumina binder layer may also include an element included in other constituent layers of the coating of the present invention (particularly an element included in the layers abutting on the alumina binder layer). Such an alumina binder layer preferably has a thickness of not less than 0.05 μm and not more than 1 μm. If the thickness is larger than 1 μm, the wear resistance deteriorates, which may not be preferred in some cases. If the thickness is less than 0.05 μm, sufficient adherence between the alumina binder layer and the outer layer may not be exhibited in some cases.

<Outer Layer>

The coating of the present invention is characterized in that it includes at least an outer layer, and preferably includes the outer layer between a state indication layer, which is described later herein, and the alumina binder layer. Such an outer layer includes α-aluminum oxide having an α-crystal structure as a main component, and therefore exhibits good performance against oxidative wear in a high-speed cutting process and contributes to improvement of the wear resistance. Here, "including α-aluminum oxide as a main component" means that the outer layer includes 50% by mass or more of α-aluminum oxide, and preferably the outer layer is made of α-aluminum oxide only except for inevitable impurities. Such an outer layer may also include zirconium, chromium, or the like in addition to α-aluminum oxide. α-aluminum oxide is advantageous in that it is generally excellent in wear resistance in a high-speed cutting process. It is noted that the crystal structure of the outer layer can be identified by means of x-ray diffraction.

The above-described outer layer is characterized in that the equivalent peak intensity PR(024) of the (024) plane of x-ray diffraction is larger than 1.3. Conventionally, in some cases, the (012) plane perpendicular to the plane direction of the base material has been focused on as an index defining the crystal structure forming the alumina layer. Unlike the present invention, however, the (024) plane has not been focused on in an attempt to study its optimum equivalent peak intensity.

According to the present invention, the (024) plane of x-ray diffraction has been focused on and it has been found that an equivalent peak intensity PR(024) of the (024) plane of x-ray diffraction that is larger than 1.3 allows the outer layer including alumina as a main component to have excellent strength. The plane index of the (024) plane and that of the (012) plane represent the same direction, and the arrangement of atoms of the (024) plane corresponds to a half of the (012) plane. Therefore, the equivalent peak intensity of the (024) plane can be increased to thereby increase the number of atoms aligned perpendicularly to the base material. Thus, the atomic density of the outer layer is increased and the strength of the outer layer is enhanced. The equivalent peak intensity PR(024) is preferably larger than 2. In contrast, if the equivalent peak intensity PR(024) is 1.3 or less, the strength of the outer layer cannot be enhanced. While the reason for this has not been clarified, it may be due to the fact that the atomic density is not necessarily made high.

In the outer layer of the present invention, the (012) plane exhibits a maximum peak intensity of x-ray diffraction and accordingly the outer layer has excellent strength. Further, the outer layer of the present invention provides an equivalent peak intensity PR(110) and an equivalent peak intensity PR(012) of larger than 1 and accordingly the outer layer has excellent strength and adhesion resistance.

The (104) plane is also a crystal plane perpendicular to the base material. According to ASTM File No. 10-173 (Powder Diffraction File Published by JCPDS International Center for Diffraction Data), the standard diffraction intensity ratio of the (024) plane is lower than the standard diffraction intensity ratio of the (012) plane and the (104) plane that are perpendicular to the base material. Therefore, it would be more effective, for enhancement of the strength of the outer layer, to increase the diffraction intensity of the (024) plane, rather than increasing the diffraction intensity of the (104) plane.

Here, PR(024) represents a relative intensity of the x-ray diffraction peak intensity from the (024) plane of the coating actually measured by means of x-ray diffraction, with respect to the isotropic grain x-ray peak intensity indicated in the ASTM data. Namely, a greater width of PR(024) means that the x-ray peak intensity from the (024) plane is stronger than other peak intensities and the orientation is in the direction of (024).

The above-described PR(024), PR(110), and PR(012) are calculated in the following manner. For the outer layer of the surface-coated cutting tool, a Cu $K\alpha_1$ (wavelength $\lambda=1.5405$ Å) x-ray source is used. By the 2θ-θ scan x-ray diffraction method, respective x-ray diffraction intensities of the eight planes, namely the (012), (104), (110), (113), (024), (116), (124), and (030) planes are measured. Based on the (hkl) planes defined by the following formulas, the intensities are calculated. As these eight crystal planes, reflection planes providing main peaks with a peak intensity of 30 or more indicated in ASTM File No. 10-173 are employed.

$$PR(024)=\{I(024)/I_0(024)\}/[\Sigma\{I(hkl)/I_0(hkl)\}/8]$$

$$PR(110)=\{I(110)/I_0(110)\}/[\Sigma\{I(hkl)/I_0(hkl)\}/8]$$

$$PR(012)=\{I(012)/I_0(012)\}/[\Sigma\{I(hkl)/I_0(hkl)\}/8]$$

In the formulas above, I(hkl) represents the actually measured x-ray diffraction intensity of the (hkl) plane. $I_0$(hkl) is the x-ray diffraction intensity indicated in ASTM File No. 10-173, and represents the x-ray diffraction intensity from the (hkl) plane of isotropically oriented powder grains.

In the outer layer of the present invention, preferably the (024) plane exhibits a maximum peak of x-ray diffraction. Thus, the ratio of (024) crystal planes is high in the outer layer, and accordingly, the outer layer represented by the plane index of the same direction as the (012) plane and having a high atomic density can be formed.

Such an outer layer preferably has a thickness of not less than 0.5 µm and not more than 15 µm, and more preferably the lower limit of the thickness is 2 µm and the upper limit of the thickness is 8 µm. If the thickness is larger than 15 µm, peeling from the tip of the cutting edge or the boundary of the cutting edge is likely to occur and the fracture resistance may be deteriorated in some cases. If the thickness is less than 0.5 µm, the resistance against crater wear of the rake face is excellent and the biting resistance in repetitive cutting such as threading or grooving may be deteriorated in some cases.

<Tangent Intersection Angle>

FIG. 1 shows an image, observed with a field emission scanning electron microscope (FE-SEM), of a surface of the outer layer in a cross section cut along a plane including a normal to the surface of the coating of the surface-coated cutting tool of the present invention. According to the present invention, the outer layer preferably includes α-aluminum oxide crystal grains. As shown in FIG. 1, in the cross section cut along a plane including a normal to the coating surface of the surface-coated cutting tool, at least 50% of the α-aluminum oxide crystal grains located in the surface of the outer layer preferably satisfies the condition that a tangent intersection angle is not less than 100° and not more than 170°. Here, the tangent intersection angle is defined as follows. Of three α-aluminum oxide crystal grains adjacent to each other located in the surface of the outer layer, one combination of two α-aluminum oxide crystal grains adjacent to each other forms one depression, and the other combination of two α-aluminum oxide crystal grains adjacent to each other forms another depression. The angle between a tangent extending from the deepest point of the one depression and a tangent extending from the deepest point of the other depression is the tangent intersection angle.

Here, the tangent intersection angle means an angle (see FIG. 1) defined in the following manner. Three α-aluminum oxide crystal grains adjacent to each other form two depressions. From respective deepest points of the two depressions, two half-lines abutting on the α-aluminum oxide crystal grains are drawn so that the half-lines intersect toward the surface side of the outer layer (toward the side opposite to the base material). Of the intersection angles formed between the intersecting half-lines, the angle protruding toward the outer layer is the tangent intersection angle (see FIG. 1). The fact that such a tangent intersection angle is an obtuse angle provides a smooth surface of the outer layer formed by the α-aluminum oxide crystal grains. In contrast, the fact that the tangent intersection angle is an acute angle provides a rough surface of the outer layer formed by the α-aluminum oxide crystal grains. The outer layer of the present invention has a smooth surface and accordingly the outer layer grows horizontally relative to the base material. Therefore, the crystal structure of the outer layer is a dense structure and the strength can be increased. The coating having such an outer layer has an obtuse tangent intersection angle, and therefore, a workpiece being cut is less likely to adhere to the coating, and the coating exhibits a property that it is excellent in wear resistance and chipping resistance.

Here, the percentage in "at least 50% of the α-aluminum oxide crystal grains" described above means the ratio of the number of α-aluminum oxide crystal grains each located between the two half-lines forming a tangent intersection angle satisfying a condition of not less than 100° and not more than 170°, to the number of α-aluminum oxide crystal grains that are present in the surface of the outer layer. Specifically, it is supposed that 10 α-aluminum oxide crystal grains are present in the surface of the outer layer, for example. When all of the tangent intersection angles formed by five of the 10 α-aluminum oxide crystal grains satisfy the condition of not less than 100° and not more than 170° while the tangent intersection angles formed by the residual α-aluminum oxide crystal grains do not satisfy this condition of not less than 100° and not more than 170°, 50% of the α-aluminum oxide crystal grains located in the surface of the outer layer has a desired tangent intersection angle.

The above-defined tangent intersection angle is found by focusing on the shape of the groove formed between α-aluminum oxide crystal grains that are present in the surface of the outer layer. Therefore, the tangent intersection angle is technically irrelevant to parameters found by focusing on only the maximum or the average of the surface roughness in a certain section such as conventionally known surface roughness parameters (Rz, Ra, Sm for example). It is impossible to define the surface shape of the outer layer of the present invention by parameters such as Rz, Ra, Sm. Namely, it is impossible for the present invention to define the shape of the groove formed between α-aluminum oxide crystal grains by conventionally known parameters (such as Rz, Ra, Sm). The present invention therefore uses a new parameter (tangent intersection angle) which replaces the conventionally known parameters to define the surface shape of the outer layer to which a workpiece is less likely to adhere. Since such a tangent intersection angle represents the shape of the groove formed between α-aluminum oxide crystal grains, apparently the value of the tangent intersection angle does not depend on the size of the α-aluminum oxide crystal grains. This idea that such a groove shape influences the adhesion resistance is original in itself, and in this respect, the present invention is an innovative invention that has not been present in the past.

More preferably, at least 65% of the α-aluminum oxide crystal grains located in the surface of the outer layer in the cross section of the surface-coated cutting tool cut along a plane including a normal to the coating surface satisfies the above-defined tangent intersection angle. Still more preferably, at least 80% of the α-aluminum oxide crystal grains located in the surface of the outer layer satisfies it.

<Surface R of α-Aluminum Oxide Crystal Grain>

Figure 2:
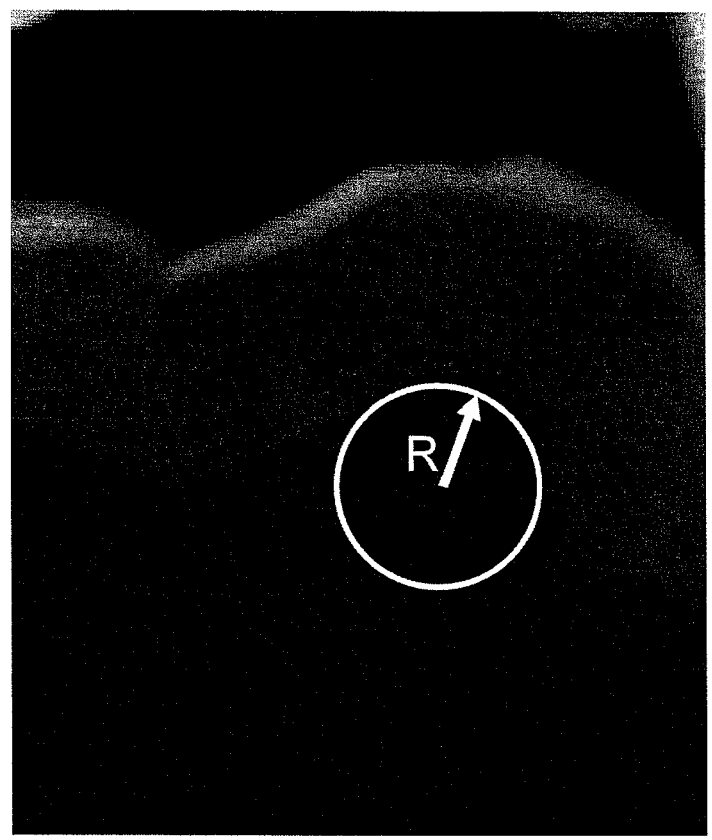
FIG. 2 shows an image, observed with a field emission scanning electron microscope, of a surface and its vicinity of an outer layer in a cross section cut along a plane including a normal to the surface of a coating of a surface-coated cutting tool.

FIG. 2 shows an image, which is observed with an FE-SEM, of a surface of the outer layer in a cross section cut along a plane including a normal to the surface of the coating of the surface-coated cutting tool of the present invention. As shown in FIG. 2, preferably at least 30% of the α-aluminum oxide crystal grains located in the surface of the outer layer when observed at a magnification of 10000 in a cross section cut along a plane including a normal to the coating surface satisfies the condition that the radius (surface R) of an inscribed circle abutting on a surface protrusion formed by one α-aluminum oxide crystal grain is 3 mm or more.

Here, the above-mentioned "surface R" is a numerical value to serve as an index representing the smoothness of the surface of the α-aluminum oxide crystal grains. As shown in FIG. 2, "surface R" means the radius of an inscribed circle abutting on the outermost portion of a protrusion of the depressions and protrusions representing a cross section of the α-aluminum oxide crystal grains. A greater value of the surface R means that the surface of the α-aluminum oxide crystal grains is smoother, and a smaller value of the surface R means that the surface of the α-aluminum oxide crystal grains has sharply pointed portions. When the surface R of α-aluminum oxide crystal grain is 3 mm or more, the surface of the outer layer has desired smoothness and a workpiece is less likely to adhere in a cutting process. The coating having such an outer layer has excellent adhesion resistance and chipping resistance in combination with the effect obtained from the orientation of the crystal plane of the outer layer as described above. Since a greater number of α-aluminum oxide crystal grains having a surface R of 3 mm or more in the surface of the outer layer makes the surface of the outer layer smoother, preferably a largest possible number of α-aluminum oxide crystal grains has a surface R of 3 mm or more.

The surface R is measured in the following way. The surface-coated cutting tool is cut along a plane including a normal to the coating surface. In a cross section thus obtained, α-aluminum oxide crystal grains located in the surface of the outer layer are observed with an FE-SEM at a magnification of 10000.

The percentage in "at least 30% of the α-aluminum oxide crystal grains" described above means the ratio of the number of α-aluminum oxide crystal grains having a surface R of 3 mm or more, to the number of α-aluminum oxide crystal grains that are present in a region of 20 μm in the surface of the outer layer. For example, it is supposed that there are 10 α-aluminum oxide crystal grains in a region of 20 μm in the surface of the outer layer. When any three of the α-aluminum oxide crystal grains have a surface R of 3 mm or more and the residual seven α-aluminum oxide crystal grains have a surface R of less than 3 mm, 30% of the α-aluminum oxide crystal grains located in the surface of the outer layer has a surface R of 3 mm or more.

The surface R of crystal grains defined for the present invention is found by focusing on the shape of the outermost layer of α-aluminum oxide crystal grains that are present in the surface of the outer layer. Therefore, the surface R is technically irrelevant to parameters found by focusing on only the maximum or the average of the surface roughness in a certain section such as conventionally known surface roughness parameters (Rz, Ra, Sm for example). It is impossible to define the surface shape of the outer layer of the present invention by parameters such as Rz, Ra, Sm. Namely, it is impossible for the present invention to define the shape of the outermost layer of α-aluminum oxide crystal grains by conventionally known parameters (such as Rz, Ra, Sm). The present invention therefore uses a new parameter (surface R of crystal grain) which replaces the conventionally known parameters to define the surface shape of the outer layer to which a workpiece is less likely to adhere. Since such a surface R of crystal grain thus defined represents the shape of the outermost layer of α-aluminum oxide crystal grains, apparently the value of the surface R does not depend on the size of the α-aluminum oxide crystal grains. This idea that such a shape of the outermost layer of crystal grains influences the adhesion resistance is original in itself, and in this respect, the present invention is an innovative invention that has not been present in the past.

More preferably, at least 50% of the α-aluminum oxide crystal grains located in the surface of the outer layer in the cross section of the surface-coated cutting tool cut along a plane including a normal to the coating surface satisfies the condition that the radius (surface R) of an inscribed circle abutting on a surface protrusion is at least 3 mm. Still more preferably, at least 70% of the α-aluminum oxide crystal grains located in the surface of the outer layer satisfies the condition that the surface R is at least 3 mm.

<State Indication Layer>

The coating of the present invention preferably includes a state indication layer forming the outermost coating surface. Here, the state indication layer preferably includes one of a Ti carbide, a Ti nitride, a Ti carbonitride, and a Ti boride as a main component. "Including one of a Ti carbide, a Ti nitride, a Ti carbonitride, and a Ti boride as a main component" means including at least 90% by mass of one of a Ti carbide, a Ti nitride, and a Ti carbonitride. Preferably, it means that the state indication layer is made of only one of a Ti carbide, a Ti nitride, and a Ti carbonitride except for inevitable impurities. Further, for each of the Ti carbide, the Ti nitride, and the Ti carbonitride, the ratio by mass between Ti and elements other than Ti (namely C, N, and CN) is preferably that the ratio of Ti is 50% by mass or more.

Among a Ti carbide, a Ti nitride, and a Ti carbonitride, the nitride of Ti (namely a compound expressed as TiN) is particularly preferred. Since TiN has a brightest color (gold) among these compounds, it has an advantage that the corner of the cutting insert after being used for cutting is easily identified.

The above-described state indication layer preferably has a thickness of not less than 0.05 μm and not more than 2 μm. If the thickness is less than 0.05 μm, it does not provide sufficient effects in the case where compressive residual stress is applied, and is not so effective for improving the fracture resistance. If the thickness is larger than 2 μm, the adherence to the layer located inside the state indication layer may be deteriorated in some cases.

<Method for Manufacture>

The coating of the present invention is formed by means of chemical vapor deposition (CVD).

For each of the layers constituting the coating except for the outer layer, the conventionally known chemical vapor deposition may be used without being particularly limited, and conditions and the like are not limited. For example, as a deposition temperature, a temperature of approximately 800 to 1050° C. may be used. As a gas to be used as well, a conventionally known gas such as nitrile-based gas like acetonitrile may be used without being particularly limited. As for the outer layer, the outer layer is formed in the following way so that the equivalent peak intensity PR(024) of x-ray diffraction is larger than 1.3.

Specifically, the outer layer may be produced by forming an alumina binder layer and thereafter oxidizing the surface of the alumina binder layer to thereby form nucleus of α-alumina, or forming α-alumina nucleus on the alumina binder layer which is in itself made of an oxide. As the temperature at which the outer layer is formed, a temperature of 850 to 1050° C. may be used. The pressure at which the outer layer is formed may be not less than 40 hPa and not more than 150 hPa. The outer layer is formed by feeding $AlCl_3$ gas at a relatively low flow rate of 2% by volume or less and successively increasing/decreasing the flow rate of $H_2S$ gas serving as a catalyst in 10 seconds to 5 minutes. The outer layer can thus be formed so that the outer layer has a crystal structure with its orientation in the (024) plane. Further, the flow rate of $H_2S$ gas can be set to a considerably low flow rate of 0.15% by volume or less to thereby form the outer layer with a maximum peak of the (012) plane. Further, the flow rate of $CO_2$ can be set to a relatively high flow rate of 4.5% by volume or more to thereby increase the orientation index of the (110) plane.

EXAMPLES

In the following, the present invention will be described in more detail in connection with Examples. The present invention, however, is not limited to them.

Examples 1-15, Comparative Examples 1-5

Examples and Comparative Examples were prepared by similar manufacturing methods to each other except that respective outer layers were formed under different conditions from each other. First, for the base material, raw material powders of a cemented carbide were mixed so that the contents of the composition were: 83.1 mass % of WC, 5.7 mass % of TiC, 1.3 mass % of TaC, 1.5 mass % of NbC, 0.4 mass % of ZrC, 0.2 mass % of $Cr_3C_2$, and 7.8 mass % of Co.

Next, the raw material powders were press-formed and held in a vacuum atmosphere at 1400° C. for one hour to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.05 mm in width. In this way, the base material in the shape of CNMG120408N-GE (manufactured by Sumitomo Electric Hardmetal) was prepared. Thus, in the surface of the base material, a β-free layer of 20 μm in thickness was formed.

Next, the base material was set in a CVD furnace, and the known thermal CVD was used to form, from the base-material side, a binder layer (TiN layer), an inner layer (MT-TiCN layer), an alumina binder layer (TiCNO layer), an outer layer (α-$Al_2O_3$), and a state indication layer (TiN layer) in this order.

Specifically, the temperature in the furnace was first set at 900° C. $TiCl_4$ gas and $N_2$ gas were used as raw-material gases and $H_2$ gas was used as a carrier gas to form a TiN layer of approximately 1 μm in thickness. Then, the temperature in the furnace was set at 860° C. As raw-material gases, 2.3 vol % of $TiCl_4$, 0.5 vol % of $CH_3CN$, and 25 vol % of $N_2$ were used. A residual content of $H_2$ gas was introduced as a carrier gas. The pressure in the furnace was set at 70 hPa. Accordingly, an MT-TiCN layer of 10 μm in thickness was formed.

Then, the temperature in the furnace was set at 980° C. As raw-material gases, 2 vol % of $TiCl_4$, 0.1 vol % of $CH_4$, and 10 vol % of $N_2$ were used. A residual content of $H_2$ gas was introduced as a carrier gas. The pressure in the furnace was set at 67 hPa. Accordingly, a TiCN binder layer was formed. After this, as raw-material gases, 2 vol % of $TiCl_4$, 0.1 vol % of $CH_4$, 10 vol % of $N_2$, 1 vol % of CO, and 2 vol % of $CO_2$ were used. A residual content of $H_2$ gas was introduced as a carrier gas. The pressure in the furnace was set at 67 hPa. Accordingly, a TiCNO layer with a total thickness of 1 μm or less was formed.

Subsequently, an outer layer with a thickness of 4 μm was formed under the conditions of the temperature in the furnace, the pressure, and the composition of the raw-material gases shown in Table 1 below. Here, as to the volume ratio of the raw-material gas "$H_2S$" in Table 1, "0.30±0.05 variation/30 s" means that the volume ratio of the introduced $H_2S$ is successively increased from 0.30 vol % to 0.35 vol %, then successively decreased to 0.25 vol %, and thereafter further increased successively to 0.30 vol %, this variation of the volume ratio of $H_2S$ is made in one cycle of 30 seconds, and the cycle is repeated to form the outer layer.

TABLE 1

| | | temperature in furnace (° C.) | pressure (hPa) | $AlCl_3$ (vol %) | $H_2S$ (vol %) | $CO_2$ (vol %) | HCl (vol %) | $H_2$ (vol %) |
|---|---|---|---|---|---|---|---|---|
| Example | 1 | 1000 | 70 | 1.6 | 0.30 ± 0.05 variation/30 s | 3.1 | 1.8 | residual |
| | 2 | 980 | 80 | 1.5 | 0.11 ± 0.04 variation/15 s | 3.0 | 2.1 | residual |
| | 3 | 960 | 50 | 1.4 | 0.27 ± 0.08 variation/30 s | 2.9 | 1.5 | residual |
| | 4 | 975 | 80 | 1.2 | 0.15 ± 0.03 variation/40 s | 4.3 | 3.2 | residual |
| | 5 | 1010 | 100 | 1.4 | 0.22 ± 0.07 variation/50 s | 4.8 | 1.7 | residual |
| | 6 | 950 | 30 | 1.0 | 0.25 ± 0.05 variation/40 s | 2.2 | 4.8 | residual |
| | 7 | 965 | 75 | 1.4 | 0.20 ± 0.05 variation/1.5 min | 3.3 | 3.3 | residual |
| | 8 | 1005 | 60 | 1.5 | 0.25 ± 0.10 variation/4 min | 4.5 | 4.2 | residual |
| | 9 | 980 | 70 | 0.9 | 0.17 ± 0.04 variation/35 s | 4.5 | 3.6 | residual |
| | 10 | 1000 | 80 | 1.2 | 0.15 ± 0.07 variation/3 min | 3.9 | 4.9 | residual |
| | 11 | 975 | 65 | 1.2 | 0.01 ± 0.05 variation/20 s | 4.9 | 3.0 | residual |
| | 12 | 960 | 70 | 0.6 | 0.14 ± 0.06 variation/2 min | 3.2 | 4.8 | residual |
| | 13 | 1010 | 85 | 2.0 | 0.23 ± 0.09 variation/3.5 min | 4.6 | 1.1 | residual |
| | 14 | 1005 | 100 | 1.9 | 0.33 ± 0.07 variation/20 s | 2.1 | 2.3 | residual |
| | 15 | 1020 | 40 | 0.8 | 0.30 ± 0.08 variation/1 min | 3.5 | 2.2 | residual |
| Comparative Example | 1 | 1010 | 9 | 1.5 | 0.30 | 4.0 | 2.0 | residual |
| | 2 | 980 | 90 | 2.0 | 0.28 | 3.7 | 2.5 | residual |
| | 3 | 1020 | 100 | 4.0 | 0.23 | 2.0 | 1.0 | residual |
| | 4 | 1000 | 350 | 8.0 | 0.15 | 2.3 | 3.0 | residual |
| | 5 | 1005 | 70 | 10.0 | 0.05 | 3.5 | 4.0 | residual |

Finally, at the same temperature as the temperature in the furnace when the outer layer was formed, $TiCl_4$ gas and $N_2$ gas were used as raw-material gases and $H_2$ gas was used as a carrier gas to form a TiN layer of approximately 1.5 μm in thickness. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, a Cu $K\alpha_1$ (wavelength $\lambda=1.5405$ Å) x-ray source was used, and based on the 2θ-θ scan x-ray diffraction method, the x-ray diffraction intensity was measured. The results are shown in the column "x-ray intensity" in Table 2. The reflection plane providing a maximum x-ray diffraction intensity is shown in the column "maximum peak" in Table 2.

TABLE 2

| | | x-ray intensity | | | | | | | | PR(024) | maximum peak |
|---|---|---|---|---|---|---|---|---|---|---|---|
| | | I(012) | I(104) | I(110) | I(113) | I(024) | I(116) | I(124) | I(030) | | |
| Example | 1 | 2177 | 98 | 1260 | 589 | 2323 | 223 | 255 | 58 | 3.14 | 024 |
| | 2 | 1811 | 98 | 2019 | 194 | 2393 | 110 | 164 | 107 | 3.04 | 024 |
| | 3 | 2005 | 756 | 1136 | 725 | 2039 | 116 | 248 | 73 | 2.85 | 024 |
| | 4 | 1350 | 2375 | 300 | 541 | 2453 | 340 | 785 | 1003 | 2.69 | 024 |
| | 5 | 1348 | 785 | 1650 | 453 | 2200 | 337 | 700 | 650 | 2.42 | 024 |
| | 6 | 750 | 669 | 798 | 361 | 987 | 696 | 109 | 500 | 2.06 | 024 |
| | 7 | 436 | 934 | 711 | 401 | 987 | 792 | 675 | 206 | 1.82 | 024 |
| | 8 | 652 | 750 | 687 | 643 | 757 | 695 | 598 | 650 | 1.36 | 024 |
| | 9 | 2405 | 98 | 1609 | 991 | 2236 | 211 | 261 | 1003 | 2.42 | 012 |
| | 10 | 1334 | 98 | 1147 | 528 | 682 | 88 | 117 | 373 | 1.51 | 012 |
| | 11 | 324 | 1095 | 2358 | 996 | 1720 | 781 | 381 | 299 | 2.01 | 110 |
| | 12 | 357 | 1722 | 2778 | 449 | 1264 | 76 | 107 | 115 | 1.69 | 110 |
| | 13 | 390 | 99 | 3004 | 225 | 874 | 68 | 171 | 197 | 1.37 | 110 |
| | 14 | 573 | 3660 | 215 | 761 | 1850 | 336 | 221 | 451 | 2.67 | 104 |
| | 15 | 623 | 2680 | 1250 | 761 | 958 | 336 | 221 | 154 | 1.51 | 104 |
| Comparative Example | 1 | 421 | 1722 | 650 | 449 | 731 | 2778 | 107 | 115 | 1.27 | 116 |
| | 2 | 568 | 3660 | 210 | 671 | 273 | 264 | 253 | 573 | 0.54 | 104 |
| | 3 | 209 | 871 | 1260 | 184 | 230 | 590 | 98 | 2 | 0.66 | 110 |
| | 4 | 324 | 1152 | 735 | 890 | 296 | 781 | 381 | 299 | 0.66 | 104 |
| | 5 | 4 | 1935 | 2600 | 23 | 5 | 520 | 12 | 220 | 0.01 | 110 |

Equivalent peak intensity PR(hkl) of a (hkl) plane defined by the following formula was calculated. Based on this PR(hkl), the x-ray peak intensity from the (024) plane of the outer layer was quantitatively evaluated.

$$PR(024) = \{I(024)/I_0(024)\} / [\Sigma\{I(hkl)/I_0(hkl)\}/8]$$

It is noted that (hkl) refers to reflection planes providing main peaks with a peak intensity of 30 or more indicated in ASTM File No. 10-173 (Powder Diffraction File Published by JCPDS International Center for Diffraction Data). Specifically, (hkl) refers to eight planes: (012), (104), (110), (113), (024), (116), (124), (030). PR(hkl) represents a relative intensity of the x-ray diffraction peak intensity from a (hkl) plane of the coating actually measured by means of x-ray diffraction, with respect to the isotropic grain x-ray diffraction peak intensity indicated in the ASTM data. A greater width of PR(hkl) means that the x-ray peak intensity from the (hkl) plane is stronger than other peak intensities and the orientation is in the (hkl) direction. In the column "PR(024)" in Table 2, the equivalent peak intensity PR(024) of the (024) plane is shown.

In the formula above, I(hkl) represents the actually measured x-ray diffraction intensity of the (hkl) plane. $I_0(hkl)$ is the x-ray diffraction intensity indicated in ASTM File No. 10-173, and represents the x-ray diffraction intensity from the (hkl) plane of isotropically oriented powder grains.

<Cutting Test>

Respective surface-coated cutting tools of the Examples and Comparative Examples were used to perform a steel machining test under the following cutting conditions A and thereby evaluate the rake face wear amount (mm) of the surface-coated cutting tool. Further, a cast-iron machining test was performed under cutting conditions B to thereby evaluate the flank face wear amount (mm) of the surface-coated cutting tool.

Cutting Test A
Workpiece: S55C round bar
Cutting Speed: 300 m/min
Feed Rate: 0.30 mm/rev (wet cutting)
Cut: 2.0 mm
Cutting Time: 23 minutes Cutting Test B
Workpiece: FCD700 round bar
Cutting Speed: 150 m/min
Feed Rate: 0.30 mm/rev (wet cutting)
Cut: 1.5 mm
Cutting Time: 15 minutes Here, the rake face wear amount and the flank face wear amount were obtained by measuring the width of wear of the surface-coated cutting tool before and after the cutting test. The results are shown in the columns "rake face wear amount" and "flank face wear amount" in Table 3. It is noted that a surface-coated cutting tool with a smaller rake face wear amount and a smaller flank face wear amount is superior in wear resistance of the surface-coated cutting tool.

TABLE 3

| | | life | |
|---|---|---|---|
| | | rake face wear amount (mm) | flank face wear amount (mm) |
| Example | 1 | 0.39 | 0.041 |
| | 2 | 0.48 | 0.046 |
| | 3 | 0.50 | 0.049 |
| | 4 | 0.41 | 0.054 |
| | 5 | 0.49 | 0.076 |
| | 6 | 0.49 | 0.078 |
| | 7 | 0.50 | 0.09 |
| | 8 | 0.65 | 0.096 |
| | 9 | 0.48 | 0.074 |
| | 10 | 0.52 | 0.091 |
| | 11 | 0.50 | 0.079 |
| | 12 | 0.61 | 0.09 |
| | 13 | 0.52 | 0.094 |
| | 14 | 0.42 | 0.066 |
| | 15 | 0.51 | 0.092 |
| Comparative Example | 1 | 0.87 | 0.168 |
| | 2 | 0.97 | 0.189 |
| | 3 | 0.91 | 0.178 |
| | 4 | 0.88 | 0.187 |
| | 5 | 1.01 | 0.211 |

It is apparent from the results shown in Table 3 that respective surface-coated cutting tools of the Examples have smaller rake face wear amounts and smaller flank face wear amounts relative to those of the Comparative Examples. It is seen from this result that respective surface-coated cutting tools of the Examples are excellent in wear resistance relative to those of the Comparative Examples. The reason for the enhanced wear resistance is considered as the enhanced strength of the outer layer. In contrast, respective surface-coated cutting tools of the Comparative Examples are insufficient in terms of the strength of the outer layer and therefore have larger wear amounts of the rake face and the flank face.

Examples 16-21, Comparative Examples 6-9

Examples and Comparative Examples were prepared by similar manufacturing methods to each other except that respective outer layers were formed under different conditions from each other. First, for the base material, raw material powders of a cemented carbide were mixed so that the contents of the composition were: 73.5 mass % of WC, 9.0 mass % of TaC, 6.7 mass % of TiC, 0.3 mass % of $Cr_3C_2$, and 10.5 mass % of Co.

Next, the raw material powders were press-formed and held in a vacuum atmosphere at 1400° C. for one hour to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.04 mm in width. In this way, the base material in the shape of SPGN120412 was prepared. In the surface of the base material thus prepared, no β-free layer was formed.

Next, the base material was set in a CVD furnace, and the known thermal CVD was used to form, from the base-material side, a binder layer (TiN layer), an inner layer (MT-TiCN layer), an alumina binder layer (TiBN layer), an outer layer (α-$Al_2O_3$), and a state indication layer (alternating TiN layer/$Al_2O_3$ layer) in this order.

Specifically, the temperature in the furnace was first set at 870° C. $TiCl_4$ gas and $N_2$ gas were used as raw-material gases and $H_2$ gas was used as a carrier gas to form a TiN layer of approximately 0.5 μm in thickness. Then, the temperature in the furnace was kept at 870° C. As raw-material gases, 2.0 vol % of $TiCl_4$, 0.4 vol % of $CH_3CN$, and 15 vol % of $N_2$ were used. A residual content of $H_2$ gas was introduced as a carrier gas. The pressure in the furnace was set at 65 hPa. Accordingly, an MT-TiCN layer of 3 μm in thickness was formed.

Then, the temperature in the furnace was set at 950° C. As raw-material gases, 2 vol % of $TiCl_4$, 0.01 vol % of $BCl_3$, and 13 vol % of $N_2$ were used. A residual content of $H_2$ gas was introduced as a carrier gas. The pressure in the furnace was set at 50 hPA. Accordingly, a TiBN layer with a thickness of approximately 0.5 μm was formed. After this, CO gas was introduced into the furnace to thereby oxidize the surface of the TiBN layer.

Subsequently, an outer layer of 2.5 μm in thickness was formed under the conditions of the temperature in the furnace, the pressure, and the contents of the composition of the raw-material gases shown in Table 4 below.

TABLE 4

|  |  | temperature in furnace (° C.) | pressure (hPa) | $AlCl_3$ (vol %) | $ZrCl_4$ (vol %) | $H_2S$ (vol %) | | $CO_2$ (vol %) | HCl (vol %) | $H_2$ (vol %) |
|---|---|---|---|---|---|---|---|---|---|---|
| Example | 16 | 980 | 65 | 1.6 | 0.3 | 0.30 ± 0.05 | variation/10 s | 3.1 | 1.8 | residual |
|  | 17 | 1005 | 80 | 1.4 | 0.5 | 0.20 ± 0.06 | variation/2 min | 3.1 | 1.8 | residual |
|  | 18 | 970 | 55 | 0.8 | 0.4 | 0.18 ± 0.04 | variation/25 s | 4.4 | 2.6 | residual |
|  | 19 | 980 | 65 | 1.1 | 0.2 | 0.10 ± 0.07 | variation/50 s | 4.9 | 3.0 | residual |
|  | 20 | 1005 | 100 | 1.9 | 0.3 | 0.33 ± 0.08 | variation/15 s | 2.1 | 2.3 | residual |
|  | 21 | 960 | 75 | 1.8 | 0.4 | 0.36 ± 0.03 | variation/5 min | 3.5 | 2.4 | residual |
| Comparative | 6 | 1000 | 40 | 2.5 | 0.3 | 0.4 |  | 2.3 | 3.3 | residual |
| Example | 7 | 980 | 55 | 4.8 | 0.5 | 0.5 |  | 2.2 | 2.5 | residual |
|  | 8 | 960 | 80 | 6.5 | 0.2 | 0.3 |  | 4.5 | 1.8 | residual |
|  | 9 | 1010 | 65 | 5.7 | 0.4 | 0.8 |  | 3.4 | 4.6 | residual |

Next, the temperature in the furnace was set at 900° C. $TiCl_4$ gas and $N_2$ gas were used as raw-material gases and $H_2$ gas was used as a carrier gas to form a TiN layer of 0.5 μm or less in thickness. Again, an outer layer with a thickness of 0.5 μm or less was formed. The TiN layer with a thickness of 0.5 μm and the outer layer with a thickness of 0.5 μm were alternately laid on each other so that three TiN layers and three outer layers alternated with each other. Finally, a state indication layer of TiN with a thickness of approximately 0.5 μm was formed. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, the same method as the x-ray diffraction method used for Examples 1 to 15 was used to measure the x-ray diffraction intensity. The results are shown in the column "x-ray intensity" in Table 5. The reflection plane providing a maximum x-ray diffraction intensity is shown in the column "maximum peak" in Table 5.

TABLE 5

|  |  | x-ray intensity | | | | | | | | | maximum |
|---|---|---|---|---|---|---|---|---|---|---|---|
|  |  | I(012) | I(104) | I(110) | I(113) | I(024) | I(116) | I(124) | I(030) | PR(024) | peak |
| Example | 16 | 2176 | 99 | 1259 | 591 | 2313 | 221 | 245 | 53 | 3.14 | 024 |
|  | 17 | 443 | 925 | 721 | 431 | 996 | 891 | 676 | 202 | 1.80 | 024 |
|  | 18 | 2399 | 96 | 1621 | 994 | 2147 | 209 | 193 | 1021 | 2.38 | 012 |
|  | 19 | 321 | 1096 | 2357 | 995 | 1719 | 779 | 365 | 321 | 2.01 | 110 |

TABLE 5-continued

| | | I(012) | I(104) | I(110) | I(113) | I(024) | I(116) | I(124) | I(030) | PR(024) | maximum peak |
|---|---|---|---|---|---|---|---|---|---|---|---|
| | | | | | x-ray intensity | | | | | | |
| | 20 | 572 | 3654 | 223 | 754 | 1848 | 335 | 219 | 466 | 2.67 | 104 |
| | 21 | 621 | 2679 | 1257 | 763 | 962 | 332 | 223 | 155 | 1.51 | 104 |
| Comparative | 6 | 420 | 1721 | 649 | 448 | 732 | 2776 | 105 | 117 | 1.27 | 116 |
| Example | 7 | 565 | 2679 | 1248 | 670 | 438 | 263 | 185 | 575 | 0.74 | 104 |
| | 8 | 323 | 1153 | 734 | 889 | 297 | 780 | 382 | 300 | 0.67 | 104 |
| | 9 | 12 | 1946 | 2634 | 15 | 6 | 527 | 7 | 221 | 0.01 | 110 |

<Cutting Test>

Respective surface-coated cutting tools of the Examples and Comparative Examples were used to perform a steel machining test under the following cutting conditions C and thereby evaluate the flank face wear amount (mm) of the surface-coated cutting tool. Further, a cast-iron machining test was performed under cutting conditions D to thereby evaluate the rake face wear amount (mm) of the surface-coated cutting tool.

Cutting Test C
Workpiece: SCM435 block material
Cutting Speed: 330 m/min
Feed Rate: 0.25 mm/rev (wet cutting)
Cut: 2.0 mm
Cut Length: 10 m
Cutting Test D
Workpiece: FC250 block material
Cutting Speed: 250 m/min
Feed Rate: 0.3 mm/rev (dry cutting)
Cut: 1.5 min
Cut Length: 12 m Here, the rake face wear amount and the flank face wear amount were obtained by measuring the width of wear of the surface-coated cutting tool before and after the cutting test. The results are shown in the columns "rake face wear amount" and "flank face wear amount" in Table 6. It is noted that a surface-coated cutting tool with a smaller rake face wear amount and a smaller flank face wear amount is superior in wear resistance of the surface-coated cutting tool.

TABLE 6

| | | life | |
|---|---|---|---|
| | | rake face wear amount (mm) | flank face wear amount (mm) |
| Example | 16 | 0.101 | 0.111 |
| | 17 | 0.113 | 0.122 |
| | 18 | 0.114 | 0.118 |
| | 19 | 0.097 | 0.102 |
| | 20 | 0.112 | 0.116 |
| | 21 | 0.122 | 0.118 |
| Comparative | 6 | 0.199 | 0.214 |
| Example | 7 | 0.187 | 0.203 |
| | 8 | 0.125 | 0.134 |
| | 9 | 0.203 | 0.223 |

It is apparent from the results shown in Table 6 that respective surface-coated cutting tools of the Examples have smaller rake face wear amounts and smaller flank face wear amounts than those of the Comparative Examples. It is seen from this result that respective surface-coated cutting tools of the Examples are excellent in wear resistance relative to those of the Comparative Examples. The reason for the enhanced wear resistance is considered as the enhanced strength of the outer layer. In contrast, respective surface-coated cutting tools of the Comparative Examples are insufficient in terms of the strength of the outer layer and therefore have larger wear amounts of the rake face and the flank face.

It has been proved from the results above that the surface-coated cutting tools of the Examples are superior in wear resistance and fracture resistance relative to the surface-coated cutting tools of the Comparative Examples.

Examples 22-36, Comparative Examples 10-14

Examples and Comparative Examples were prepared by similar manufacturing methods to each other except that respective outer layers were formed under different conditions from each other. First, for the base material, raw material powders of a cemented carbide were mixed so that the contents of the composition were: 82.1 mass % of WC, 7.7 mass % of TiC, 1.2 mass % of TaC, 1.4 mass % of NbC, 0.2 mass % of $Cr_3C_2$, and 7.4 mass % of Co.

Next, the raw material powders were press-formed and held in a vacuum atmosphere at 1410° C. for one hour to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.05 mm in width. In this way, the base material in the shape of CNMG120408N-GU (manufactured by Sumitomo Electric Hardmetal) was prepared. In the surface of the base material thus prepared, no β-free layer was formed.

Next, the base material was set in a CVD furnace, and the known thermal CVD was used to form, from the base-material side, a binder layer (TiN layer), an inner layer (MT-TiCN layer), an alumina binder layer (TiCNO layer), an outer layer (α-$Al_2O_3$), and a state indication layer (TiN layer) in this order.

Specifically, the temperature in the furnace was first set at 890° C. $TiCl_4$ gas and $N_2$ gas were used as raw-material gases and $H_2$ gas was used as a carrier gas to form a TiN layer of approximately 1 μm in thickness. Then, the temperature in the furnace was set at 870° C. As raw-material gases, 2.1 vol % of $TiCl_4$, 0.45 vol % of $CH_3CN$, and 26 vol % of $N_2$ were used. A residual content of $H_2$ gas was introduced as a carrier gas. The pressure in the furnace was set at 68 hPa. Accordingly, an MT-TiCN layer of 8 μm in thickness was formed.

Then, the temperature in the furnace was set at 980° C. As raw-material gases, 2.1 vol % of $TiCl_4$, 0.1 vol % of $CH_4$, and 10 vol % of $N_2$ were used. A residual content of $H_2$ gas was introduced as a carrier gas. The pressure in the furnace was set at 67 hPA. Accordingly, a TiCN binder layer was formed. After this, the temperature in the furnace was set at 1010° C. As raw-material gases, 2.3 vol % of $TiCl_4$, 0.1 vol % of $CH_4$, 10 vol % of $N_2$, 1.1 vol % of CO, and 1.1 vol % of $CO_2$ were used. A residual content of $H_2$ gas was introduced as a carrier gas. The pressure in the furnace was set at 67 hPa. Accordingly, a TiCNO layer with a thickness of approximately 1 μm was formed.

Subsequently, an outer layer with a thickness of 4 μm was formed under the conditions of the temperature in the furnace, the pressure, and the composition of the raw-material gases shown in Table 7 below. Here, as to the volume ratio of the raw-material gas "$H_2S$" in Table 7, "0.13±0.01 variation/35S" means that the volume ratio of the introduced $H_2S$ is successively increased from 0.13 vol % to 0.14 vol %, then successively decreased to 0.12 vol %, and thereafter further increased successively to 0.13 vol %, this variation of the volume ratio of $H_2S$ is made in one cycle of 35 seconds, and the cycle is repeated to form the outer layer.

Finally, at the same temperature as the temperature in the furnace when the outer layer was formed, $TiCl_4$ gas and $N_2$ gas were used as raw-material gases and $H_2$ gas was used as a carrier gas to form a TiN layer of approximately 1.0 μm in thickness. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, a Cu $K\alpha_1$ (wavelength λ=1.5405 Å) x-ray source was used, and based on the 2θ-θ scan x-ray diffraction method, the x-ray diffraction intensity was measured. The results are shown in the column "x-ray intensity" in Table 8. The reflection plane providing a maximum x-ray diffraction intensity is shown in the column "maximum peak" in Table 8.

TABLE 7

|  |  | temperature in furnace (° C.) | pressure (hPa) | $AlCl_3$ (vol %) | $H_2S$ (vol %) | $CO_2$ (vol %) | HCl (vol %) | $H_2$ (vol %) |
|---|---|---|---|---|---|---|---|---|
| Example | 22 | 1005 | 68 | 1.49 | 0.13 ± 0.01 variation/35 s | 2.9 | 1.8 | residual |
|  | 23 | 986 | 77 | 1.40 | 0.11 ± 0.04 variation/15 s | 2.8 | 2.0 | residual |
|  | 24 | 967 | 50 | 1.30 | 0.07 ± 0.07 variation/25 s | 2.7 | 1.5 | residual |
|  | 25 | 981 | 77 | 1.12 | 0.14 ± 0.01 variation/40 s | 4.0 | 3.0 | residual |
|  | 26 | 1015 | 95 | 1.30 | 0.12 ± 0.03 variation/55 s | 4.5 | 1.7 | residual |
|  | 27 | 958 | 32 | 0.93 | 0.05 ± 0.05 variation/45 s | 2.0 | 4.5 | residual |
|  | 28 | 972 | 73 | 1.30 | 0.11 ± 0.03 variation/1.5 min | 3.1 | 3.1 | residual |
|  | 29 | 1010 | 59 | 1.40 | 0.10 ± 0.04 variation/4 min | 4.2 | 3.9 | residual |
|  | 30 | 986 | 68 | 0.84 | 0.08 ± 0.04 variation/30 s | 4.2 | 3.4 | residual |
|  | 31 | 1005 | 77 | 1.12 | 0.01 ± 0.07 variation/3 min | 3.6 | 4.6 | residual |
|  | 32 | 981 | 64 | 1.12 | 0.03 ± 0.10 variation/25 a | 4.6 | 2.9 | residual |
|  | 33 | 967 | 68 | 0.56 | 0.14 ± 0.01 variation/2 min | 3.0 | 4.5 | residual |
|  | 34 | 1015 | 82 | 1.86 | 0.09 ± 0.03 variation/2.5 min | 4.3 | 1.1 | residual |
|  | 35 | 1010 | 95 | 1.77 | 0.06 ± 0.07 variation/25 s | 2.0 | 2.2 | residual |
|  | 36 | 1024 | 41 | 0.74 | 0.11 ± 0.04 variation/1 min | 3.3 | 2.1 | residual |
| Comparative | 10 | 1005 | 70 | 1.3 | 0.17 ± 0.10 variation/20 s | 3.9 | 2.1 | residual |
| Example | 11 | 980 | 88 | 1.9 | 0.14 ± 0.05 variation/20 s | 2.7 | 2.6 | residual |
|  | 12 | 1011 | 100 | 4.0 | 0.23 | 3.0 | 1.2 | residual |
|  | 13 | 990 | 350 | 8.0 | 0.15 | 3.3 | 3.3 | residual |
|  | 14 | 968 | 70 | 10.0 | 0.05 | 2.5 | 3.5 | residual |

TABLE 8

|  |  | x-ray intensity | | | | | | | | maximum peak | ratio of 100°-170° (%) |
|---|---|---|---|---|---|---|---|---|---|---|---|
|  |  | I(012) | I(104) | I(110) | I(113) | I(024) | I(116) | I(124) | I(030) | PR(024) | | |
| Example | 22 | 1112 | 119 | 728 | 384 | 573 | 152 | 133 | 214 | 1.66 | 012 | 95 |
|  | 23 | 843 | 102 | 770 | 388 | 479 | 89 | 112 | 343 | 1.47 | 012 | 86 |
|  | 24 | 1310 | 97 | 820 | 461 | 614 | 123 | 131 | 211 | 1.62 | 012 | 72 |
|  | 25 | 1377 | 112 | 341 | 297 | 816 | 247 | 57 | 22 | 2.69 | 012 | 93 |
|  | 26 | 2368 | 114 | 804 | 567 | 876 | 191 | 129 | 92 | 1.80 | 012 | 79 |
|  | 27 | 1764 | 49 | 1137 | 493 | 646 | 79 | 97 | 392 | 1.37 | 012 | 75 |
|  | 28 | 2407 | 51 | 1327 | 573 | 861 | 109 | 132 | 328 | 1.49 | 012 | 65 |
|  | 29 | 1526 | 38 | 532 | 310 | 964 | 98 | 84 | 12 | 2.73 | 012 | 50 |
|  | 30 | 1356 | 33 | 629 | 78 | 1110 | 59 | 43 | 0 | 3.19 | 012 | 82 |
|  | 31 | 1068 | 95 | 602 | 0 | 945 | 144 | 46 | 23 | 3.05 | 012 | 55 |
|  | 32 | 1855 | 12 | 817 | 454 | 1198 | 55 | 95 | 490 | 2.37 | 012 | 64 |
|  | 33 | 1793 | 56 | 985 | 235 | 1200 | 65 | 99 | 580 | 2.27 | 012 | 51 |
|  | 34 | 1755 | 0 | 534 | 456 | 1257 | 102 | 83 | 325 | 2.80 | 012 | 53 |
|  | 35 | 1691 | 7 | 601 | 370 | 914 | 51 | 74 | 354 | 2.26 | 012 | 87 |
|  | 36 | 1673 | 758 | 633 | 123 | 985 | 123 | 57 | 9 | 2.39 | 012 | 58 |
| Comparative | 10 | 2114 | 142 | 1758 | 440 | 674 | 47 | 137 | 236 | 1.16 | 012 | 24 |
| Example | 11 | 3556 | 3485 | 209 | 450 | 765 | 351 | 453 | 50 | 1.02 | 012 | 49 |
|  | 12 | 878 | 75 | 897 | 325 | 470 | 78 | 136 | 196 | 1.44 | 110 | 30 |
|  | 13 | 853 | 2598 | 1150 | 761 | 863 | 257 | 212 | 144 | 2.26 | 104 | 47 |
|  | 14 | 780 | 77 | 694 | 349 | 863 | 100 | 134 | 595 | 2.23 | 024 | 16 |

Then, equivalent peak intensity PR(hkl) of a (hkl) plane defined by the following formula was calculated. Based on this PR(hkl), the x-ray peak intensity from the (024) plane of the outer layer was evaluated. In the column "PR(024)" in Table 8, equivalent peak intensity PR(hkl) of the (024) plane is shown.

<Evaluation of Tangent Intersection Angle of Outer Layer>

Respective surface-coated cutting tools of the Examples and Comparative Examples were each cut along a plane including a normal to the coating surface, and the resultant cross section was mechanically polished and thereafter further ion-polished. For a region of 20 μm in length in the polished surface, an FE-SEM was used to perform three-field measurement at a magnification of 5000 to 20000 on α-aluminum oxide crystal grains located in the surface of the outer layer to thereby observe the α-aluminum oxide crystal grains located in the surface of the outer layer. Then, from respective deepest points of depressions formed by α-aluminum oxide crystal grains adjacent to each other, half-lines abutting on the α-aluminum oxide crystal grains were drawn toward the outside of the outer layer. Of the intersection angles formed between the intersecting half-lines, the angle protruding toward the outer layer (tangent intersection angle) was determined. Then, the ratio of α-aluminum oxide crystal grains providing a tangent intersection angle of 100° to 170° to α-aluminum oxide crystal grains located in the region of 20 μm in length was determined. The results are shown in the column "ratio of 100°-170°" in Table 8.

<Cutting Test>

Respective surface-coated cutting tools of the Examples and Comparative Examples were used to perform a steel machining test under the following cutting conditions A and thereby evaluate the flank face wear amount (mm) of the surface-coated cutting tool. Further, a stainless-steel machining test was performed under cutting conditions B to thereby evaluate the wear amount (mm) of the boundary region of the surface-coated cutting tool.

Cutting Test A
Workpiece: S45C round bar
Cutting Speed: 280 m/min
Feed Rate: 0.25 mm/rev (wet cutting)
Cut: 1.7 mm
Cutting Time: 15 minutes
Cutting Test B
Workpiece: SUS316 round bar
Cutting Speed: 180 m/min
Feed Rate: 0.4 mm/rev (wet cutting)
Cut: 1.5 mm
Cutting Time: 15 minutes Here, the value representing "flank face wear amount" was obtained by measuring the width of wear of the flank face of the surface-coated cutting tool before and after the cutting test, and shown in the column "flank face wear amount" in Table 9. It is noted that a surface-coated cutting tool with a smaller flank face wear amount is superior in wear resistance of the surface-coated cutting tool.

Further, the value representing "boundary wear amount" was obtained by measuring wear of the lateral flank face boundary of the surface-coated cutting tool before and after the cutting test, and shown in the column "boundary wear amount" in Table 9. It is noted that a surface-coated cutting tool with a smaller boundary wear amount is superior in adhesion resistance and oxidation resistance of the surface-coated cutting tool.

TABLE 9

|  |  | life | |
|---|---|---|---|
|  |  | flank face wear amount (mm) | boundary wear amount (mm) |
| Example | 22 | 0.032 | 0.45 |
|  | 23 | 0.036 | 0.53 |
|  | 24 | 0.039 | 0.55 |
|  | 25 | 0.044 | 0.47 |
|  | 26 | 0.063 | 0.54 |
|  | 27 | 0.065 | 0.54 |
|  | 28 | 0.076 | 0.55 |
|  | 29 | 0.081 | 0.69 |
|  | 30 | 0.062 | 0.53 |
|  | 31 | 0.077 | 0.57 |
|  | 32 | 0.066 | 0.55 |
|  | 33 | 0.076 | 0.65 |
|  | 34 | 0.080 | 0.57 |
|  | 35 | 0.054 | 0.48 |
|  | 36 | 0.078 | 0.56 |
| Comparative Example | 10 | 0.165 | 0.97 |
|  | 11 | 0.146 | 0.88 |
|  | 12 | 0.155 | 0.92 |
|  | 13 | 0.163 | 0.89 |
|  | 14 | 0.185 | 1.01 |

It is apparent from the results shown in Table 9 that respective surface-coated cutting tools of the Examples have smaller flank face wear amounts and smaller boundary wear amounts than those of the Comparative Examples. It is seen from this result that respective surface-coated cutting tools of the Examples are excellent in wear resistance relative to those of the Comparative Examples. The reason for the enhanced wear resistance of the surface-coated cutting tool of each Example is considered as the enhanced strength of the outer layer. In contrast, respective surface-coated cutting tools of the Comparative Examples are insufficient in terms of the strength of the outer layer, and therefore, the outer layer peels off in the initial stage of the cutting process and the flank face wear and the boundary wear increase.

Examples 37-42, Comparative Examples 15-18

Examples and Comparative Examples were prepared by similar manufacturing methods to each other except that respective outer layers were formed under different conditions from each other. First, for the base material, raw material powders of a cemented carbide were mixed so that the contents of the composition were: 72.5 mass % of WC, 8.5 mass % of TaC, 6.7 mass % of TiC, 0.5 mass % of $Cr_3C_2$, and 11.8 mass % of Co.

Next, the raw material powders were press-formed and held in a vacuum atmosphere at 1395° C. for one and a half hours to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.04 mm in width. In this way, the base material in the shape of SPGN120412 was prepared. In the surface of the base material thus prepared, no β-free layer was formed.

Next, the base material was set in a CVD furnace, and the known thermal CVD was used to form, from the base-material side, a binder layer (TiN layer), an inner layer (MT-TiCN layer), an alumina binder layer (TiBN layer), an outer layer ($\alpha$-$Al_2O_3$), and a state indication layer (alternating TiN layer/$Al_2O_3$ layer) in this order.

Specifically, the temperature in the furnace was first set at 880° C. $TiCl_4$ gas and $N_2$ gas were used as raw-material gases and H$_2$ gas was used as a carrier gas to form a TiN layer of approximately 0.5 μm in thickness. Then, the temperature in the furnace was set at 880° C. As raw-material gases, 2.1 vol % of TiCl$_4$, 0.3 vol % of CH$_3$CN, and 15 vol % of N$_2$ were used. A residual content of H$_2$ gas was introduced as a carrier gas. The pressure in the furnace was set at 65 hPa. Accordingly, an MT-TiCN layer of 3 μm in thickness was formed.

Then, the temperature in the furnace was set at 950° C. As raw-material gases, 2 vol % of TiCl$_4$, 0.01 vol % of BCl$_3$, and 13 vol % of N$_2$ were used. A residual content of H$_2$ gas was introduced as a carrier gas. The pressure in the furnace was set at 50 hPA. Accordingly, a TiBN layer with a thickness of approximately 1 μm was formed. After this, CO gas was introduced in the furnace to thereby oxidize the surface of the TiBN layer.

Subsequently, an outer layer with a thickness of 2.5 μm was formed under the conditions of the temperature in the furnace, the pressure, and the contents of the raw-material gases shown in Table 10 below.

of approximately 0.4 μm was formed. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, the x-ray diffraction intensity was measured by a similar method to the x-ray diffraction method used for Examples 22 to 36. The results are shown in the column "x-ray intensity" in Table 11. The reflection plane providing a maximum x-ray diffraction intensity is shown in the column "maximum peak" in Table 11.

TABLE 10

| | | temperature in furnace (° C.) | pressure (hPa) | AlCl$_3$ (vol %) | ZrCl$_4$ (vol %) | H$_2$S (vol %) | CO$_2$ (vol %) | HCl (vol %) | H$_2$ (vol %) |
|---|---|---|---|---|---|---|---|---|---|
| Example | 37 | 986 | 64 | 1.49 | 0.4 | 0.13 ± 0.0005 variation/20 s | 2.9 | 1.7 | residual |
| | 38 | 1010 | 77 | 1.30 | 0.6 | 0.02 ± 0.06 variation/1.5 min | 2.9 | 1.7 | residual |
| | 39 | 977 | 55 | 0.74 | 0.5 | 0.08 ± 0.04 variation/25 s | 4.1 | 2.4 | residual |
| | 40 | 986 | 64 | 1.02 | 0.3 | 0.10 ± 0.03 variation/45 s | 4.6 | 2.8 | residual |
| | 41 | 1010 | 95 | 1.77 | 0.4 | 0.13 ± 0.02 variation/10 s | 2.0 | 2.1 | residual |
| | 42 | 967 | 73 | 1.67 | 0.5 | 0.02 ± 0.11 variation/4.5 min | 3.3 | 2.2 | residual |
| Commparative Example | 15 | 995 | 55 | 2.0 | 0.2 | 0.25 ± 0.02 variation/10 s | 2.2 | 3.0 | residual |
| | 16 | 978 | 66 | 4.7 | 0.4 | 0.4 | 2.4 | 2.6 | residual |
| | 17 | 965 | 78 | 5.5 | 0.25 | 0.5 | 4.4 | 1.5 | residual |
| | 18 | 1015 | 54 | 4.7 | 0.45 | 0.7 | 4.3 | 2.0 | residual |

Next, the temperature in the furnace was set at 900° C. TiCl$_4$ gas and N$_2$ gas were used as raw-material gases and H$_2$ gas was used as a carrier gas to form a TiN layer with a thickness of approximately of 0.4 μm. Again, an outer layer with a thickness of approximately 0.5 μm was formed. The TiN layer with a thickness of 0.5 μm and the outer layer with a thickness of 0.5 μm were alternately laid on each other so that four TiN layers and four outer layers alternated with each other. Finally, a state indication layer of TiN with a thickness <Evaluation of Tangent Intersection Angle of Outer Layer>

For the outer layer of the coating surface of the surface-coated cutting tool of the Examples and Comparative Examples each, a similar method to the method used for Examples 22 to 36 was used to calculate the ratio of α-aluminum oxide crystal grains providing a tangent intersection angle of 100° to 170°. The results are shown in the column "ratio of 100°-170°" in Table 11.

TABLE 11

| | | x-ray intensity | | | | | | | | maximum peak | ratio of 100°-170° (%) |
|---|---|---|---|---|---|---|---|---|---|---|---|
| | | I(012) | I(104) | I(110) | I(113) | I(024) | I(116) | I(124) | I(030) | PR(024) | |
| Example | 37 | 1011 | 117 | 665 | 356 | 526 | 147 | 130 | 203 | 1.64 | 012 | 75 |
| | 38 | 895 | 117 | 819 | 417 | 513 | 103 | 128 | 370 | 1.47 | 012 | 64 |
| | 39 | 1189 | 97 | 748 | 425 | 563 | 121 | 128 | 200 | 1.61 | 012 | 59 |
| | 40 | 2496 | 130 | 854 | 605 | 930 | 211 | 145 | 107 | 1.79 | 012 | 98 |
| | 41 | 1598 | 54 | 1033 | 454 | 591 | 81 | 97 | 363 | 1.37 | 012 | 66 |
| | 42 | 2537 | 64 | 1403 | 612 | 914 | 124 | 149 | 354 | 1.48 | 012 | 55 |
| Comparative Example | 15 | 2356 | 72 | 1793 | 235 | 864 | 65 | 569 | 580 | 1.18 | 012 | 42 |
| | 16 | 856 | 2566 | 1147 | 766 | 866 | 272 | 228 | 161 | 1.40 | 104 | 45 |
| | 17 | 880 | 94 | 899 | 339 | 481 | 96 | 153 | 212 | 1.43 | 110 | 48 |
| | 18 | 780 | 77 | 694 | 349 | 863 | 100 | 134 | 595 | 2.23 | 024 | 30 |

<Cutting Test>

Respective surface-coated cutting tools of the Examples and Comparative Examples were used to perform a steel machining test under the following cutting conditions C and a cast-iron machining test under the cutting conditions D to thereby evaluate the rake face wear amount (mm) of the surface-coated cutting tool.

Cutting Test C
Workpiece: SCM435 block material
Cutting Speed: 320 m/min
Feed Rate: 0.25 mm/rev (wet cutting)
Cut: 1.5 mm
Cut Length: 10 m
Cutting Test D
Workpiece: FC250 block material
Cutting Speed: 260 m/min
Feed Rate: 0.25 mm/rev (dry cutting)
Cut: 1.5 mm
Cut Length: 12 m Here, "flank face wear amount" was obtained by measuring the width of wear of the surface-coated cutting tool before and after the cutting test. The results are shown in Table 12. It is noted that a surface-coated cutting tool with a smaller flank face wear amount is superior in wear resistance of the surface-coated cutting tool.

TABLE 12

| workpiece | | wear resistance test (mm) | |
| --- | --- | --- | --- |
| | | steel | cast iron |
| Example | 37 | 0.101 | 0.112 |
| | 38 | 0.114 | 0.123 |
| | 39 | 0.115 | 0.119 |
| | 40 | 0.097 | 0.102 |
| | 41 | 0.113 | 0.117 |
| | 42 | 0.123 | 0.119 |
| Comparative Example | 15 | 0.204 | 0.220 |
| | 16 | 0.191 | 0.208 |
| | 17 | 0.126 | 0.136 |
| | 18 | 0.208 | 0.229 |

It is apparent from the results shown in Table 12 that respective surface-coated cutting tools of the Examples have smaller flank face wear amounts than those of the Comparative Examples. It is considered that, because respective surface-coated cutting tools of the Comparative Examples have lower strength of the outer layer, the outer layer peels off in the initial stage of the cutting process and the wear of the flank face increases. Therefore, respective surface-coated cutting tools of the Examples are superior in wear resistance to those of the Comparative Examples. The reason for the enhancement of the wear resistance is considered as the enhanced strength of the outer layer.

It has been proved from the results above that the surface-coated cutting tools of the Examples are superior in wear resistance to the surface-coated cutting tools of the Comparative Examples.

Examples 43-52, Comparative Examples 19-23

Examples and Comparative Examples were prepared by similar manufacturing methods to each other except that respective outer layers were formed under different conditions from each other. First, for the base material, raw material powders of a cemented carbide were mixed so that the contents of the composition were: 81.4 mass % of WC, 6.7 mass % of TiC, 1.4 mass % of TaC, 1.2 mass % of NbC, 2.0 mass % of ZrC, 0.4 mass % of $Cr_3C_2$, and 6.9 mass % of Co.

Next, the raw material powders were press-formed and held in a vacuum atmosphere at 1390° C. for one hour to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.06 mm in width. In this way, the base material in the shape of CNMG120408N-GE (manufactured by Sumitomo Electric Hardmetal) was prepared. In the surface of the base material thus prepared, a β-free layer of 10 μm in thickness was formed.

Next, the base material was set in a CVD furnace, and the known thermal CVD was used to form, from the base-material side, a binder layer (TiN layer), an inner layer (MT-TiCN layer), an alumina binder layer (TiCNO layer), an outer layer (α-$Al_2O_3$), and a state indication layer (TiN layer) in this order.

Specifically, the temperature in the furnace was first set at 890° C. $TiCl_4$ gas and $N_2$ gas were used as raw-material gases and $H_2$ gas was used as a carrier gas to form a TiN layer of approximately 1 μm in thickness. Then, the temperature in the furnace was set at 860° C. As raw-material gases, 2.2 vol % of $TiCl_4$, 0.47 vol % of $CH_3CN$, and 25 vol % of $N_2$ were used. A residual content of $H_2$ gas was introduced as a carrier gas. The pressure in the furnace was set at 70 hPa. Accordingly, an MT-TiCN layer of 10 μm in thickness was formed.

Then, the temperature in the furnace ("temperature in furnace" in Table 13) was set at the same temperature as the temperature at which the outer layer was formed as described later herein. As raw-material gases, 2.0 vol % of $TiCl_4$, 0.2 vol % of $CH_4$, and 10 vol % of $N_2$ were used. A residual content of $H_2$ gas was introduced as a carrier gas. The pressure in the furnace was set at 70 hPA. Accordingly, a TiCN binder layer was formed. After this, the temperature in the furnace was maintained and, as raw-material gases, 2.2 vol % of $TiCl_4$, 0.2 vol % of $CH_4$, 10 vol % of $N_2$, 1.2 vol % of CO, and 1.2 vol % of $CO_2$ were used. A residual content of $H_2$ gas was introduced as a carrier gas. The pressure in the furnace was set at 70 hPa. Accordingly, a TiCNO layer with a thickness of approximately 1 μm was formed.

Subsequently, an outer layer with a thickness of 4.5 μm was formed under the conditions of the temperature in the furnace, the pressure, and the contents of the composition of the raw-material gases shown in Table 13 below. Here, as to the volume ratio of the raw-material gas "$H_2S$" in Table 13, "0.14±0.01 variation/35S" means that the volume ratio of the introduced $H_2S$ is successively increased from 0.14 vol % to 0.15 vol %, then successively decreased to 0.13 vol %, and thereafter further increased successively to 0.14 vol %, this variation of the volume ratio of $H_2S$ is made in one cycle of 35 seconds, and the cycle is repeated to form the outer layer.

TABLE 13

|  |  | temperature in furnace (° C.) | pressure (hPa) | AlCl$_3$ (vol %) | H$_2$S (vol %) |  | CO$_2$ (vol %) | HCl (vol %) | H$_2$ (vol %) |
|---|---|---|---|---|---|---|---|---|---|
| Example | 43 | 935 | 66 | 1.39 | 0.14 ± 0.01 | variation/35 s | 4.7 | 1.7 | residual |
|  | 44 | 917 | 74 | 1.31 | 0.12 ± 0.04 | variation/15 s | 4.6 | 1.9 | residual |
|  | 45 | 900 | 50 | 1.22 | 0.06 ± 0.07 | variation/25 s | 4.5 | 1.4 | residual |
|  | 46 | 913 | 74 | 1.06 | 0.13 ± 0.01 | variation/40 s | 4.7 | 2.8 | residual |
|  | 47 | 944 | 91 | 1.22 | 0.11 ± 0.03 | variation/55 s | 5.1 | 1.6 | residual |
|  | 48 | 892 | 34 | 0.89 | 0.06 ± 0.05 | variation/45 s | 4.9 | 4.1 | residual |
|  | 49 | 905 | 71 | 1.22 | 0.12 ± 0.03 | variation/1.5 min | 4.8 | 2.8 | residual |
|  | 50 | 939 | 58 | 1.31 | 0.10 ± 0.05 | variation/4 min | 4.8 | 3.6 | residual |
|  | 51 | 917 | 66 | 0.81 | 0.09 ± 0.04 | variation/30 s | 4.8 | 3.1 | residual |
|  | 52 | 935 | 74 | 1.06 | 0.02 ± 0.07 | variation/3 min | 4.3 | 4.2 | residual |
| Comparative | 19 | 935 | 68 | 1.22 | 0.27 ± 0.10 | variation/20 s | 5.6 | 1.9 | residual |
| Example | 20 | 1012 | 84 | 2.76 | 0.10 ± 0.02 | variation/20 s | 5.5 | 2.4 | residual |
|  | 21 | 940 | 95 | 1.65 |  | 0.13 | 2.8 | 1.1 | residual |
|  | 22 | 921 | 120 | 1.25 |  | 0.25 | 5.0 | 3.0 | residual |
|  | 23 | 1001 | 68 | 1.05 |  | 0.05 | 4.3 | 3.2 | residual |

Finally, at the same temperature as the temperature in the furnace when the outer layer was formed, TiCl$_4$ gas and N$_2$ gas were used as raw-material gases and H$_2$ gas was used as a carrier gas to form a TiN layer of approximately 1.0 μm in thickness. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, a Cu Kα$_1$ (wavelength λ=1.5405 A) x-ray source was used, and based on the 2θ-θ scan x-ray diffraction method, the x-ray diffraction intensity was measured. The results are shown in the column "x-ray intensity" in Table 14.

<Evaluation of Surface R of α-Aluminum Oxide Crystal Grains>

Respective surface-coated cutting tools of the Examples and Comparative

Examples were each cut along a plane including a normal to the coating surface, and the resultant cross section was mechanically polished and thereafter further ion-polished. For a region of 20 μm in length in the polished surface, an FE-SEM was used to perform three-field measurement at a magnification of 10000 on α-aluminum oxide crystal grains located in the surface of the outer layer. Accordingly, the radius (surface R) of an inscribed circle abutting on a protrusion formed by an α-aluminum oxide crystal grain located in the surface of the outer layer was calculated. Then, the ratio of

TABLE 14

|  |  | x-ray intensity |  |  |  |  |  |  |  |  |  |  | ratio of R = 3 mm or |
|---|---|---|---|---|---|---|---|---|---|---|---|---|---|
|  |  | I(012) | I(104) | I(110) | I(113) | I(024) | I(116) | I(124) | I(030) | PR(024) | PR(110) | PR(012) | more (%) |
| Example | 43 | 546 | 117 | 523 | 376 | 562 | 149 | 130 | 210 | 2.07 | 2.17 | 1.21 | 69 |
|  | 44 | 927 | 112 | 847 | 427 | 527 | 98 | 123 | 377 | 1.47 | 2.66 | 1.55 | 41 |
|  | 45 | 1255 | 102 | 789 | 448 | 593 | 127 | 134 | 210 | 1.61 | 2.41 | 2.04 | 58 |
|  | 46 | 932 | 100 | 324 | 281 | 790 | 232 | 46 | 12 | 3.01 | 1.39 | 2.13 | 86 |
|  | 47 | 856 | 125 | 884 | 624 | 964 | 210 | 142 | 101 | 2.38 | 2.46 | 1.27 | 73 |
|  | 48 | 762 | 785 | 543 | 503 | 564 | 97 | 115 | 404 | 1.59 | 1.72 | 1.29 | 55 |
|  | 49 | 1203 | 2013 | 1675 | 695 | 1069 | 92 | 122 | 376 | 1.54 | 2.71 | 1.04 | 43 |
|  | 50 | 1515 | 57 | 356 | 324 | 965 | 116 | 102 | 32 | 2.86 | 1.19 | 2.70 | 75 |
|  | 51 | 1740 | 20 | 543 | 467 | 652 | 120 | 101 | 339 | 1.71 | 1.60 | 2.74 | 64 |
|  | 52 | 1035 | 110 | 592 | 20 | 318 | 157 | 64 | 42 | 1.35 | 2.82 | 2.63 | 35 |
| Comparative | 19 | 934 | 171 | 952 | 409 | 447 | 174 | 229 | 286 | 1.28 | 4.63 | 0.28 | 27 |
| Example | 20 | 230 | 183 | 2042 | 526 | 632 | 74 | 178 | 291 | 1.17 | 2.81 | 1.47 | 10 |
|  | 21 | 4610 | 4518 | 259 | 572 | 135 | 443 | 576 | 52 | 0.16 | 0.34 | 3.22 | 26 |
|  | 22 | 1129 | 3397 | 1515 | 1009 | 942 | 354 | 296 | 207 | 1.20 | 2.16 | 0.86 | 14 |
|  | 23 | 1370 | 316 | 263 | 724 | 495 | 350 | 401 | 1093 | 1.02 | 0.61 | 1.70 | 5 |

Then, the equivalent peak intensity PR(hkl) of a (hid) plane defined by the following formula was calculated. Based on this PR(hkl), the x-ray peak intensities from the (024) plane, the (110) plane, and the (012) plane of the outer layer were quantitatively evaluated.

$$PR(024) = \{I(024)/I_0(024)\}/[\Sigma\{I(hkl)/I_0(hkl)\}/8]$$

$$PR(110) = \{I(110)/I_0(110)\}/[\Sigma\{I(hkl)/I_0(hkl)\}/8]$$

$$PR(012) = \{I(012)/I_0(012)\}/[\Sigma\{I(hkl)/I_0(hkl)\}/8]$$

α-aluminum oxide crystal grains with a surface R of 3 mm or more to the α-aluminum oxide crystal grains in the region of 20 μm in length was determined. The results are shown in the column "ratio of R=3 mm or more" in Table 14.

<Cutting Test>

Respective surface-coated cutting tools of the Examples and Comparative Examples were used to perform a steel machining test under the following cutting conditions A and thereby evaluate the flank face wear amount (mm) of the surface-coated cutting tool. Further, a cast-iron intermittent cutting test was performed under cutting conditions B to thereby evaluate the number of times (count) impact was applied before chipping or fracture occurred to the surface-coated cutting tool.

Cutting Test A
Workpiece: S45C round bar
Cutting Speed: 260 m/min
Feed Rate: 0.4 mm/rev (wet cutting)
Cut: 2.0 mm
Cutting Time: 12 minutes
Cutting Test B
Workpiece: FC250 (round bar with four grooves)
Cutting Speed: 190 m/min
Feed Rate: 0.25 mm/rev (wet cutting)
Cut: 1.5 mm Here, the width of wear of the flank face of the surface-coated cutting tool was measured before and after the cutting test and the obtained value representing the width of wear is shown in the column "flank face wear amount" in Table 15. It is noted that a surface-coated cutting tool with a smaller flank face wear amount is superior in wear resistance of the surface-coated cutting tool.

Further, the number of times impact was applied before chipping or fracture occurred to the surface-coated cutting tool while a cast iron was intermittently cut with the surface-coated cutting tool is shown in the column "count of impact" in Table 15. It is noted that as the count of impact is higher, fracture is less likely to occur.

TABLE 15

|  |  | life | |
| --- | --- | --- | --- |
|  |  | flank face wear amount (mm) | count of impact (count) |
| Example | 43 | 0.048 | 4892 |
|  | 44 | 0.077 | 4172 |
|  | 45 | 0.065 | 4802 |
|  | 46 | 0.037 | 6152 |
|  | 47 | 0.043 | 4892 |
|  | 48 | 0.067 | 4712 |
|  | 49 | 0.076 | 4712 |
|  | 50 | 0.04 | 5072 |
|  | 51 | 0.064 | 4802 |
|  | 52 | 0.081 | 3992 |
| Comparative Example | 19 | 0.139 | 3011 |
|  | 20 | 0.157 | 2651 |
|  | 21 | 0.148 | 2741 |
|  | 22 | 0.155 | 2891 |
|  | 23 | 0.175 | 2621 |

It is apparent from the results shown in Table 15 that respective surface-coated cutting tools of the Examples have smaller flank face wear amounts and higher counts of impact than those of the Comparative Examples. It is seen from this result that respective surface-coated cutting tools of the Examples are excellent in wear resistance and fracture resistance relative to those of the Comparative Examples. The reason for the enhanced wear resistance and fracture resistance is considered as the enhanced strength of the outer layer and the enhanced adhesion resistance of the coating. In contrast, it is considered that, because respective surface-coated cutting tools of the Comparative Examples are insufficient in terms of the strength of the outer layer, the outer layer peels off in the initial stage of the cutting process and the wear of the flank face increases or chipping or fracture occurs.

Examples 53-57, Comparative Examples 24-27

Examples and Comparative Examples were prepared by similar manufacturing methods to each other except that respective outer layers were formed under different conditions from each other. First, for the base material, raw material powders of a cemented carbide were mixed so that the contents of the composition were: 74.4 mass % of WC, 7.5 mass % of TaC, 7.7 mass % of TiC, 0.3 mass % of $Cr_3C_2$, and 10.8 mass % of Co.

Next, the raw material powders were press-formed and held in a vacuum atmosphere at 1380° C. for one and a half hours to thereby sinter the raw material powders of the cemented carbide. After this, the press-formed body was removed from the furnace, and the surface of the body was smooth-polished. Then, on the ridgeline of the cutting edge, edge treatment was performed with an SiC brush so that the amount of honing from the rake face side was 0.03 mm in width. In this way, the base material in the shape of SPGN120412 was prepared. In the surface of the base material thus prepared, no β-free layer was formed.

Next, the base material was set in a CVD furnace, and the known thermal CVD was used to form, from the base-material side, a binder layer (TiN layer), an inner layer (MT-TiCN layer), an alumina binder layer (TiBN layer), an outer layer (α-$Al_2O_3$), and a state indication layer (alternating TiN layer/$Al_2O_3$ layer) in this order.

Specifically, the temperature in the furnace was first set at 880° C. $TiCl_4$ gas and $N_2$ gas were used as raw-material gases and $H_2$ gas was used as a carrier gas to form a TiN layer of approximately 0.5 μm in thickness. Then, the temperature in the furnace was kept at 840° C. As raw-material gases, 2.0 vol % of $TiCl_4$, 0.4 vol % of $CH_3CN$, and 17 vol % of $N_2$ were used. A residual content of $H_2$ gas was introduced as a carrier gas. The pressure in the furnace was set at 70 hPa. Accordingly, an MT-TiCN layer of 3 μm in thickness was formed.

Then, the temperature in the furnace ("temperature in furnace" in Table 16) was set at the same temperature as the temperature at which the outer layer was formed as described later herein. As raw-material gases, 1.8 vol % of $TiCl_4$, 0.02 vol % of $BCl_3$, and 15 vol % of $N_2$ were used. A residual content of $H_2$ gas was introduced as a carrier gas. The pressure in the furnace was set at 50 hPA. Accordingly, a TiBN layer with a thickness of approximately 1 μm was formed.

Subsequently, an outer layer of 2.0 μm in thickness was formed under the conditions of the temperature in the furnace, the pressure, and the contents of the composition of the raw-material gases shown in Table 16 below.

TABLE 16

|  |  | temperature in furnace (° C.) | pressure (hPa) | $AlCl_3$ (vol %) | $ZrCl_4$ (vol %) | $H_2S$ (vol %) | | $CO_2$ (vol %) | HCl (vol %) | $H_2$ (vol %) |
| --- | --- | --- | --- | --- | --- | --- | --- | --- | --- | --- |
| Example | 53 | 917 | 63 | 1.39 | 0.41 | 0.12 ± 0.005 | variation/20 s | 4.7 | 1.6 | residual |
|  | 54 | 939 | 74 | 1.22 | 0.59 | 0.03 ± 0.06 | variation/1.5 min | 4.7 | 1.6 | residual |
|  | 55 | 909 | 55 | 0.72 | 0.50 | 0.09 ± 0.04 | variation/25 s | 4.7 | 2.2 | residual |
|  | 56 | 917 | 63 | 0.97 | 0.32 | 0.11 ± 0.03 | variation/45 s | 5.2 | 2.6 | residual |
|  | 57 | 939 | 91 | 1.64 | 0.41 | 0.12 ± 0.02 | variation/10 s | 4.9 | 1.9 | residual |

TABLE 16-continued

|  | | temperature in furnace (° C.) | pressure (hPa) | AlCl$_3$ (vol %) | ZrCl$_4$ (vol %) | H$_2$S (vol %) | CO$_2$ (vol %) | HCl (vol %) | H$_2$ (vol %) |
|---|---|---|---|---|---|---|---|---|---|
| Comparative | 24 | 926 | 55 | 2.85 | 0.23 | 0.10 ± 0.02 variation/10 s | 5.0 | 2.8 | residual |
| Example | 25 | 910 | 64 | 4.28 | 0.41 | 0.54 | 5.2 | 2.4 | residual |
|  | 26 | 1010 | 75 | 5.00 | 0.28 | 0.45 | 4.5 | 1.4 | residual |
|  | 27 | 944 | 54 | 4.28 | 0.46 | 0.13 | 3.9 | 1.9 | residual |

Next, the temperature at which the outer layer was formed was maintained. TiCl$_4$ gas and N$_2$ gas were used as raw-material gases and H$_2$ gas was used as a carrier gas to form a TiN layer of approximately 0.4 μm in thickness. Again, an outer layer with a thickness of approximately 0.4 μm was formed. The TiN layer with a thickness of 0.4 μm and the outer layer with a thickness of 0.4 μm were alternately laid on each other so that five TiN layers and five outer layers alternated with each other. Finally, a state indication layer of TiN with a thickness of approximately 0.4 μm was formed. In this way, respective surface-coated cutting tools of the Examples and Comparative Examples were prepared.

<Evaluation of Equivalent Peak Intensity of Outer Layer>

For respective outer layers of the surface-coated cutting tools of the Examples and Comparative Examples prepared in the above-described manner, the x-ray diffraction method used for Examples 43 to 52 was used to measure the x-ray diffraction intensity. The results are shown in the column "x-ray intensity" in Table 17. Further, analysis was conducted similarly to the method for analysis used for Examples 43 to 52 to thereby calculate the equivalent peak intensities PR(hkl) of the (024) plane, the (110) plane, and the (012) plane. The values representing the intensities are shown in the columns "PR(024)" and "PR(110)" and "PR(012)" in Table 17.

<Evaluation of Surface R of α-Aluminum Oxide Crystal Grains>

For the outer layer of the coating surface of the surface-coated cutting tool in the Examples and Comparative Examples each, a similar method to the method used for Examples 43 to 52 was used to thereby calculate the ratio of α-aluminum oxide crystal grains with a surface R of 3 mm or more. The results are shown in the column "ratio of R=3 mm or more" in Table 17.

<Cutting Test>

Respective surface-coated cutting tools of the Examples and Comparative Examples were used to perform a cast iron machining test under the following cutting conditions C and thereby evaluate the flank face wear amount (mm) of the surface-coated cutting tool. Further, a steel machining test was performed under the following cutting conditions D to thereby evaluate the cut length (mm) before fracture occurred to the surface-coated cutting tool.

Cutting Test C
Workpiece: FC250 block material
Cutting Speed: 270 in/min
Feed Rate: 0.35 mm/rev (dry cutting)
Cut: 1.5 mm
Cut Length: 12 m
Cutting Test D
Workpiece: four S50C plate materials
Cutting Speed: 150 m/min
Feed Rate: 0.27 mm/rev (dry cutting)
Cut: 2.0 mm Here, the flank face wear amount was obtained by measuring the width of wear of the surface-coated cutting tool before and after the cutting test. The results are shown in Table 18. It is noted that a surface-coated cutting tool with a smaller flank face wear amount is superior in wear resistance. "Cut Length" in Table 18 refers to the length of cut before chipping or fracture occurred to the surface-coated cutting tool while steel machining was continued with the surface-coated cutting tool. It is noted that as the cut length is longer, fracture is less likely to occur.

TABLE 18

|  | | wear resistance test (mm) | cut length before fracture (mm) |
|---|---|---|---|
| Example | 53 | 0.111 | 1120 |
|  | 54 | 0.112 | 1230 |
|  | 55 | 0.095 | 1190 |

TABLE 17

|  | | x-ray intensity | | | | | | | | | | | ratio of R = 3 mm or more (%) |
|---|---|---|---|---|---|---|---|---|---|---|---|---|---|
|  | | I(012) | I(104) | I(110) | I(113) | I(024) | I(116) | I(124) | I(030) | PR(024) | PR(110) | PR(012) | |
| Example | 53 | 535 | 143 | 351 | 408 | 597 | 176 | 157 | 238 | 2.255 | 1.493 | 1.214 | 54 |
|  | 54 | 972 | 116 | 358 | 446 | 551 | 101 | 127 | 394 | 1.839 | 1.344 | 1.945 | 35 |
|  | 55 | 573 | 146 | 456 | 637 | 844 | 181 | 192 | 300 | 2.482 | 1.509 | 1.011 | 83 |
|  | 56 | 698 | 158 | 876 | 629 | 951 | 238 | 174 | 136 | 2.351 | 2.437 | 1.036 | 60 |
|  | 57 | 783 | 55 | 292 | 575 | 754 | 90 | 111 | 457 | 2.444 | 1.065 | 1.523 | 75 |
| Comparative | 24 | 2000 | 97 | 1531 | 233 | 757 | 91 | 511 | 520 | 1.18 | 2.69 | 1.88 | 18 |
| Example | 25 | 885 | 2253 | 1118 | 813 | 793 | 417 | 382 | 329 | 1.23 | 1.94 | 0.82 | 26 |
|  | 26 | 268 | 123 | 209 | 392 | 186 | 126 | 189 | 253 | 1.06 | 1.34 | 0.92 | 4 |
|  | 27 | 599 | 110 | 215 | 377 | 281 | 133 | 166 | 618 | 1.13 | 0.97 | 1.45 | 13 |

TABLE 18-continued

|  |  | wear resistance test (mm) | cut length before fracture (mm) |
|---|---|---|---|
|  | 56 | 0.11 | 1020 |
|  | 57 | 0.099 | 1170 |
| Comparative Example | 24 | 0.28 | 440 |
|  | 25 | 0.221 | 416 |
|  | 26 | 0.295 | 272 |
|  | 27 | 0.292 | 458 |

It is apparent from the results shown in Table 18 that respective surface-coated cutting tools of the Examples have smaller flank face wear amounts and fracture is less likely to occur relative to those of the Comparative Examples. Thus, it is seen that respective surface-coated cutting tools of the Examples are excellent in wear resistance and fracture resistance relative to those of the Comparative Examples. The reason for the enhanced wear resistance and fracture resistance of the surface-coated cutting tool of each Example is considered as the enhanced strength of the outer layer. In contrast, it is considered that, because the surface-coated cutting tool of each Comparative Example has weak strength and adherence of the outer layer, the outer layer peels off in the initial stage of the cutting process and wear of the flank face increases or fracture occurs.

It has been proved from the results above that the surface-coated cutting tools of the Examples are superior in wear resistance relative to the surface-coated cutting tools of the Comparative Examples.

While the embodiments and examples of the present invention have heretofore been described, it is originally intended to appropriately combine the features of the above-described embodiments and examples each.

It should be construed that the embodiments and examples disclosed herein are by way of illustration in all respects, not by way of limitation. It is intended that the scope of the present invention is defined by claims, not by the description above, and encompasses all modifications and variations equivalent in meaning and scope to the claims.

The invention claimed is:

1. A surface-coated cutting tool comprising a base material and a coating formed on the base material,
    said coating including at least an inner layer and an outer layer,
    said inner layer being a single layer or a multilayer stack constituted of two or more layers made of
        at least one element selected from the group consisting of group IVa elements, group Va elements, group VIa elements in the periodic table, Al, and Si, or
        a compound of at least one element selected from the group consisting of group IVa elements, group Va elements, group VIa elements in the periodic table, Al, and Si and at least one element selected from the group consisting of carbon, nitrogen, oxygen, and boron, and
    said outer layer including α-aluminum oxide as a main component and exhibiting an equivalent peak intensity PR(024) of a (024) plane of x-ray diffraction of larger than 1.3,
    said outer layer including α-aluminum oxide crystal grains,
    at least 50% of α-aluminum oxide crystal grains located in a surface of said outer layer in a cross section of said surface-coated cutting tool cut along a plane including a normal to a surface of said coating satisfies a condition that
        a tangent intersection angle between intersecting tangents is not less than 100° and not more than 170°, where one of the intersecting tangents extends from a deepest point of a depression formed by one combination of two said α-aluminum oxide crystal grains adjacent to each other among three said α-aluminum oxide crystal grains adjacent to each other and located in the surface of said outer layer, and the other of the intersecting tangents extends from a deepest point of a depression formed by the other combination of two said α aluminum oxide crystal grains adjacent to each other among said three α-aluminum oxide crystal grains.

2. The surface-coated cutting tool according to claim 1, wherein said equivalent peak intensity PR(024) is larger than 2.0.

3. The surface-coated cutting tool according to claim 1, wherein the (024) plane of said alumina layer exhibits a maximum peak of x-ray diffraction.

4. The surface-coated cutting tool according to claim 1, wherein a (012) plane of said outer layer exhibits a maximum peak intensity of x-ray diffraction.

5. The surface-coated cutting tool according to claim 1, wherein
    said outer layer includes α-aluminum oxide crystal grains,
    at least 65% of α-aluminum oxide crystal grains located in a surface of said outer layer in a cross section of said surface-coated cutting tool cut along a plane including a normal to a surface of said coating satisfies a condition that
        a tangent intersection angle between intersecting tangents is not less than 100° and not more than 170°, where one of the intersecting tangents extends from a deepest point of a depression formed by one combination of two said α-aluminum oxide crystal grains adjacent to each other among three said α-aluminum oxide crystal grains adjacent to each other and located in the surface of said outer layer, and the other of the intersecting tangents extends from a deepest point of a depression formed by the other combination of two said α aluminum oxide crystal grains adjacent to each other among said three α-aluminum oxide crystal grains.

6. The surface-coated cutting tool according to claim 1, wherein
    said outer layer includes α-aluminum oxide crystal grains,
    at least 80% of α-aluminum oxide crystal grains located in a surface of said outer layer in a cross section of said surface-coated cutting tool cut along a plane including a normal to a surface of said coating satisfies a condition that
        a tangent intersection angle between intersecting tangents is not less than 100° and not more than 170°, where one of the intersecting tangents extends from a deepest point of a depression formed by one combination of two said α-aluminum oxide crystal grains adjacent to each other among three said α-aluminum oxide crystal grains adjacent to each other and located in the surface of said outer layer, and the other of the intersecting tangents extends from a deepest point of a depression formed by the other combination of two said α aluminum oxide crystal grains adjacent to each other among said three α-aluminum oxide crystal grains.

7. The surface-coated cutting tool according to claim 1, wherein said outer layer exhibits an equivalent peak intensity PR(110) of a (110) plane of x-ray diffraction and an equivalent peak intensity PR(012) of a (012) plane of x-ray diffraction that are both larger than 1.

8. The surface-coated cutting tool according to claim 1, wherein said outer layer includes α-aluminum oxide crystal grains, and at least 30% of α-aluminum oxide crystal grains that are located in a surface of said outer layer in a cross section of said surface-coated cutting tool cut along a plane including a normal to a surface of said coating and are observed at a magnification of 10000 satisfies a condition that a radius of an inscribed circle abutting on a surface protrusion of one said α-aluminum oxide crystal grain is not less than 3 mm.

9. The surface-coated cutting tool according to claim 1, wherein said outer layer includes α-aluminum oxide crystal grains, and at least 50% of α-aluminum oxide crystal grains that are located in a surface of said outer layer in a cross section of said surface-coated cutting tool cut along a plane including a normal to a surface of said coating and are observed at a magnification of 10000 satisfies a condition that a radius of an inscribed circle abutting on a surface protrusion of one said α-aluminum oxide crystal grain is not less than 3 mm.

10. The surface-coated cutting tool according to claim 1, wherein said outer layer includes α-aluminum oxide crystal grains, and at least 70% of α-aluminum oxide crystal grains that are located in a surface of said outer layer in a cross section of said surface-coated cutting tool cut along a plane including a normal to a surface of said coating and are observed at a magnification of 10000 satisfies a condition that a radius of an inscribed circle abutting on a surface protrusion of one said α-aluminum oxide crystal grain is not less than 3 mm.

* * * * *